(12) United States Patent
Tanizaki et al.

(10) Patent No.: US 6,466,509 B1
(45) Date of Patent: Oct. 15, 2002

(54) SEMICONDUCTOR MEMORY DEVICE HAVING A COLUMN SELECT LINE TRANSMITTING A COLUMN SELECT SIGNAL

(75) Inventors: Hiroaki Tanizaki, Hyogo (JP); Shigeki Tomishima, Hyogo (JP); Mitsutaka Niiro, Hyogo (JP); Masanao Maruta, Hyogo (JP); Hiroshi Kato, Hyogo (JP); Masatoshi Ishikawa, Hyogo (JP); Takaharu Tsuji, Hyogo (JP); Hideto Hidaka, Hyogo (JP); Tsukasa Ooishi, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 10/050,131

(22) Filed: Jan. 18, 2002

(30) Foreign Application Priority Data

Aug. 1, 2001 (JP) ........................................ 2001-233308

(51) Int. Cl.7 ................................................. G11C 8/00
(52) U.S. Cl. ............................. 365/230.03; 365/189.01
(58) Field of Search ....................... 365/230.03, 189.01, 365/189.05, 189.08, 191, 230.06, 205, 230.04

(56) References Cited

U.S. PATENT DOCUMENTS 6,314,045 B1 * 11/2001 Ikeda .................... 365/189.01

OTHER PUBLICATIONS

"Ultra LSI Memory", Kiyoo Ito, Advanced Electronics Series, I–9, Baifukan, Nov. 5, 1994, pp. 166–177.

* cited by examiner

Primary Examiner—David Lam
(74) Attorney, Agent, or Firm—McDermott, Will & Emery

(57) ABSTRACT

First and second memory banks are provided with M memory blocks each having first and second memory regions, M representing an even number of no less than two, and (M+1) sense amplifier bands arranged on opposite sides of each memory block, and have first and second select lines arranged therefor to select the first and second memory regions, respectively, the first select line being connected to an odd-numbered sense amplifier band of the first memory bank and an even-numbered sense amplifier band of the second memory bank, the second select line being connected to an even-numbered sense amplifier band of the first memory bank and an odd-numbered sense amplifier band of the second memory bank.

10 Claims, 27 Drawing Sheets

SEMICONDUCTOR MEMORY DEVICE HAVING A COLUMN SELECT LINE TRANSMITTING A COLUMN SELECT SIGNAL

BACKGROUND OF THE INVENTION

1. Field of the Invention

The present invention relates generally to semiconductor memory devices and particularly to those providing a faster column-related operation.

2. Description of the Background Art

In recent years, there has been a demand for increasing data in capacity and also communicating the data rapidly and a multi input and output and multibank, logic embedded dynamic random access memory (eDRAM) has accordingly been generally used.

FIG. 24 represents a relationship between a memory bank BK and column select lines CSL_ODD<1:0> and CSL_EVEN<1:0>. Note that hereinafter for a plurality of bits <Z:0>, 0 to Z are applied, wherein Z represents a natural number.

Memory bank BK includes a row decoder 1004, a sense amplifier bands SAG(0)-SAG(4) (hereinafter generally referred to as a sense amplifier band SAG), and memory blocks MBL(0)-MBL(3) (hereinafter generally referred to as a memory block MBL). Each memory block MBL is arranged between sense amplifier bands SAGs. When a signal is input from column select lines CSL_ODD<1:0> and CSL_EVEN<1:0> to each sense amplifier band SAG a signal is input to each sense amplifier band SAG via a driver DRI. Each sense amplifier band SAG includes a plurality of bit line select circuits BSLs and it is activated by any signal input from column select lines CSL_ODD<1:0> and CSL_EVEN<1:0> to electrically connect each bit line pair and input/output line pairs IO(0), /IO(0) to IO(m), /IO(m) respectively (hereinafter generally referred to as an input/output line pair IO, /IO) to read or write data, wherein m represents a natural number. Each input/output line pair IO and /IO is arranged orthogonal to each memory block MBL.

A description will now be provided of a sense amplifier block 1100 including bit line select circuit BSLs of their respective sense amplifier bands SAG(0) and SAG(1) at the bottom. The other sense amplifier blocks are similarly configured and thus will not be described specifically.

FIG. 25 shows a circuit configuration of sense amplifier block 1100.

Each sense amplifier band SAG has a circuit configuration in a shared SA system and sense amplifier block 1100 includes an input/output line pair /IO(m) and IO(m), bit line pairs BL0, /BL0 to /BL3, BL3, hereinafter generally referred to as a bit line pair BL and /BL, a sense amplifier circuit S/A, and column select lines CSL_ODD1, CSL_ODD0, CSL_EVEN1 and CSL_EVEN0.

Column select lines CSL_ODD1 and CSL_ODD0 connect with bit line select circuits BSL0, BSL1, respectively. Each bit line pair BL, /BL is connected to each bit line select circuit BSL via sense amplifier circuit S/A. Furthermore, bit line select circuit BSL0 and BSL1 are connected to input/output line pair IO(m), /IO(m) respectively.

FIG. 26 shows a circuit configuration of bit line select circuits BSL0 and BSL1.

Bit line select circuits BSL0 and BSL1 include N channel MOS transistors NT1, NT2, respectively, operating as a gate circuit, and when bit line select circuit BSL0 is activated by a signal on column select line CSL_ODD1 and n channel MOS transistor NT1 turns on, input/output line pair IO(m), /IO(m) and bit line pair BL3, /BL3 are electrically coupled together. When bit line select circuit BSL1 is activated by a signal on column select line CSL_ODD0 and N channel MOS transistor NT2 turns on, input/output line pair IO(m), /IO(m) and bit line pair BL1, /BL1 are electrically coupled together. Thus one of the signals on column select lines CSL_ODD1 and CSL_ODD0 input activates each bit line select circuit BSL connected to the respective signal lines and data is thus read or written.

Reference will again be made to FIG. 24 to consider an example with a plurality of memory banks BKs.

Memory bank BK shares column select lines CSL_EVEN<1:0> and CSL_ODD<1:0>. Column select line CSL_EVEN<1:0>, connected to odd-numbered sense amplifier bands SAGs, has two drivers DRIs connected for a unit memory bank BK, and column select line CSL_ODD<1:0>, connected to even-numbered sense amplifier bands SAGs, has three drivers DRIs connected per a unit memory bank BK. This results in a ratio in load of two to three and column select line CSL_ODD<1:0> is larger in load than column select line CSL_EVEN<1:0>, resulting in a delayed timing of a signal to be transmitted.

FIG. 27 is timing plots in a write operation.

As shown in FIG. 27, in the write operation input/output line pair IO and /IO is driven in response to data to high and low levels, respectively. During that period, bit line pair BL, /BL must be selected in response to column select lines CSL_EVEN<1:0> and CSL_ODD<1:0> to write data, although if there is a difference in tiling between column select lines CSL_EVEN<1:0> and CSL_ODD<1:0> that is associated with a difference in load, input/output line pair IO, /IO must be driven continuously throughout a period satisfying the difference in timing of the two. Thus a column cycle (tC) cannot be reduced and rapid column-related operation cannot be achieved.

FIG. 28 shows another configuration different from that of FIG. 24, showing a memory bank configuration effecting a column select operation in response to a predecoded signal.

FIG. 28 schematically shows memory banks #0–#3 and a column decode circuit 2a.

Memory banks #0–#3 are similar in configuration and memory bank#0 will be described representatively.

Memory bank#0 includes memory blocks M0–M3 (memory banks #1–#3 include memory blocks M4–M15) and sense amplifier bands SAG#0a to SAG#0e (hereinafter generally referred to as a sense amplifier band SAG#0) and memory cell arrays 10–13 are each arranged between two of sense amplifier bands SAG#0a to SAG#0e. Column decode circuit 2a includes a column predecode circuit 300, a block select line BS<15:0> corresponding to each of memory blocks M0–M15, hereinafter generally referred to as a block select line BS), a bank select line SBA<3:0> corresponding to each of memory banks #0–#3, hereinafter generally referred to as a bank select line SBA), column select lines CSLER<3:0> and CSLOR<3:0> shared by all memory banks and dedicated to reading data, (hereinafter generally referred to as column select lines CSLER and CSLOR), column select lines CSLEW<3:0> and CSLOW<3:0> shared by all memory banks and dedicated to writing data (hereinafter generally referred to as column select lines CSLEW and CSLOW), CSL decode circuits 100a–100e (hereinafter generally referred to as a CSL decode circuit 100), and block select latch circuits 200a–200d (hereinafter generally referred to as a block select latch circuit 200). While herein column select lines CSLER and CSLOR or column select lines CSLEW and CSLOW are adapted to have an 8-bit configuration, they are not limited thereto and may be of n1 bit equal to or grater than eight bits, wherein n1 represents a natural number.

FIG. 29 shows circuit configurations of column predecode circuit 300.

In FIG. 29(A) a column address NCA<2:0> is a signal representing a column address CA<2:0> that is inverted by an inverter INV.

FIG. 29(B) shows a timing generation circuit GT receiving clock signals Read. CLK and Write. CLK exclusively for read and write operations to generate timing signals RTM and WTM, respectively.

FIG. 29(C) shows a data reading logic unit generating a signal selecting any one of column select lines CSLER0–CSLER3 and CSLOR0–CSLOR3. While herein a column select line is selected for reading data, also for writing data, timing signal WTM for the write operation is received and one of writing column select lines CSLEW<3:0> and CSLOW<3:0> is selected.

AND circuit 301 receives column addresses NCA(0) –NCA(2) input, performs a logical operation thereon and outputs the result of the operation to an AND circuit 302 and AND circuit 302 receives timing signal RTM and an output of AND circuit 301, performs a logical operation thereon and transmits the result of the operation to column select line CSLER0. An AND circuit 303 receives column addresses NCA(0), CA(1) and NCA(2), performs a logical operation thereon and outputs the result of the operation to an AND circuit 304, and AND circuit 304 receives timing signal RTM and an output of AND circuit 303, performs a logical operation thereon and transmits the result of the operation to column select line CSLER1. An AND circuit 305 receives column addresses NCA(0), NCA(1) and CA(2), performs a logical operation thereon and outputs the result of the operation to an AND circuit 306, and AND circuit 306 receives timing signal RTM and an output of AND circuit 305, performs a logical operation thereon and transmits the result of the operation to column select line CSLER2. An AND circuit 307 receives column addresses NCA(0), CA(1) and CA(2), performs a logical operation thereon and outputs the result of the operation to an AND circuit 308, and AND circuit 308 receives timing signal RTM and an output of AND circuit 307, performs a logical operation thereon and transmits the result of the operation to column select line CSLER 3.

An AND circuit 309 receives column addresses CA(0), NCA(1) and NCA(2), performs a logical operation thereon and outputs the result of the operation to an AND circuit 310, and AND circuit 310 receives timing signal RTM and an output of AND circuit 309, performs a logical operation thereon and transmits the result of the operation to column select line CSLOR0. An AND circuit 311 receives column addresses CA(0), CA(1) and NCA(2), performs a logical operation thereon and outputs the result of the operation to an AND circuit 312, and AND circuit 312 receives timing signal RTM and an output of AND circuit 311, performs a logical operation thereon and transmits the result of the operation to column select line CSLOR1. An AND circuit 313 receives column addresses CA(0), NCA(1), CA(2), performs a logical operation thereon and outputs the result of the operation to an AND circuit 314, and AND circuit 314 receives timing signal RTM and an output of AND circuit 313, performs a logical operation thereon and transmits the result of the operation to column select line CSLOR2. An AND circuit 315 receives column addresses CA(0), CA(1), CA(2), performs a logical operation thereon and outputs the result of the operation to an AND circuit 316, and AND circuit 316 receives timing signal RTM and an output of AND circuit 315, performs a logical operation thereon and transmits the result of the operation to column select line CSLOR3.

For example, if timing signal RTM have a high level and column addresses NCA(0)–NCA(2) all have a high level, column select line CSLER0 is activated and thus attains a high level and a column is selected to read data.

FIG. 30 shows a circuit configuration of a block select latch circuit 200a.

Although herein block select latch circuit 200a alone will be described, other block select latch circuits 200b–200e have a similar circuit configuration and thus will not be described specifically.

Block select latch circuit 200a includes a latch circuit LAT and drivers 201 and 202.

Latch circuit LAT receives a signal on block select line BS0 and timing signal RTM (WTM), latches the signal on block select line BS0, and uses drivers 201 and 202 to generate latch control signals XL0 and YL0, respectively. For example, latch circuit LAT operates in response to timing signal RTM (WTM) of a high level to latch the signal on block select line BS0 and output it to CSL decode circuit 100.

FIG. 31 shows a circuit configuration of CSL decode circuit 100b connected to an odd-numbered sense amplifier band SAG#0b.

CSL decode circuit 100b is connected to an odd-numbered sense amplifier band SAG#0b, and receives signals on column select lines CSLEW<3:0> and CSLER<3:0>, latch control signals YL1 and XL0 and a signal on bank select line SAB0 to generate a column select signal CLEW<3:0> used to select a column to write data and a column select signal CLER<3:0> used to select a column to read data (hereinafter generally referred to as column select signals CLEW and CLER).

CSL decode circuit 100b includes a logic circuit 106, inverters 101–103 and NAND circuits 104 and 105.

Logic circuit 106 includes AND circuits 108 and 109 and an NOR circuit 107. AND circuit 108 receives latch control signal YL1 and a signal on bank select line SBA0, performs a logical operation thereon and outputs the result of the operation to NOR circuit 107. AND circuit 109 receives latch control signal XL0 and the signal on bank select line SBA0, performs a logical operation thereon and outputs the result of the operation to NOR circuit 107. NOR circuit 107 receives the outputs of AND circuits 108 and 109, performs a logical operation thereon and outputs the result of the operation. Inverter 103 receives the signal from logic circuit 106, inverts the signal and outputs the inverted signal to NAND circuits 104 and 105. NAND circuit 104 is connected to column select line CSLEW<3:0> and inverter 103 to receive signals from the column select line and the inverter, performs a logical operation thereon and outputs the result of the operation to inverter 101. Inverter 101 receives a signal from NAND circuit 104 and inverts the signal to generate column select signal CLEW<3:0>, NAND circuit 105 is connected to column select line CSLER<3:0> and inverter 103 to receive signals from the column select line and the inverter, performs a logical operation thereon and outputs the result of the operation to inverter 102. Inverter 102 receives the signal from NAND circuit 105 and inverts the signal to generate column select signal CLER<3:0>.

For example, if latch control signals YL1 and XL0 both have a high level and bank select line SBA0 also has a high level, AND circuits 108 and 109 both attain a high level. Accordingly, NOR circuit 107 outputs a signal having a low level and thus via inverter 103 NAND circuits 104 and 105 each receive a signal having a high level. Thus if of column select line CSLEW<3:0> column select line CSLEW0 transmits a signal having a high level then column select signal CLEW0 attains a high level and if of CSLER<3:0> column select line CSLER0 transmits a signal having a high level then column select signal CLER0 attains a high level. In response to such column select signals sense amplifier band SAG#0b allows a column to be selected to read/write data.

While herein CSL decode circuit 100b is described, CSL decode circuit 100d has a similar configuration and it thus will not be described specifically.

FIG. 32 shows a circuit configuration of CSL decode circuit 100c connected to an even-numbered sense amplifier band SAG#0c, operative in response to signals on column select lines CSLOW<3:0> and CSLOR<3:0> to generate column select signals CLOW<3:0> and CLOR<3:0>, respectively. It has a circuit connection similar to that of CSL decode circuit 100b and thus will not be described specifically.

CSL decode circuits 100a and 100e are different from CSL decode circuit 100c in that in the former a latch control signal input is a signal input. More specifically, for CSL decode circuit 100a, latch control signal XL1 input to NAND circuit 109 is replaced with a ground voltage GND (of a low level) for input. For CSL decode circuit 100e, latch control signal YL2 input to NAND circuit 108 is replaced with ground voltage GND (of the low level) for input. The reminder is similar to that of CSL decode circuit 100c and thus will not be described specifically.

FIG. 33 shows a relationship of bit line pair BL, /BL for sense amplifier bands SAG#0b and SAG#0c arranged on opposite sides of memory block M1.

Herein sense amplifier band SAG#0 is provided in a shared SA system.

Memory block M1 includes bit line pairs BL0, /BL0 to BL7, /BL7. Sense amplifier band SAG#0b includes sense amplifier control circuits SAC0–SAC3 (hereinafter generally referred to as a sense amplifier control circuit SAC) each corresponding to an even-numbered bit line pair BL, /BL, and sense amplifier band SAG#0c includes sense amplifier control circuit SAC arranged to correspond to an odd-numbered bit line pair BL, /BL, respectively. Furthermore each sense amplifier control circuit SAC is connected to an input/output line pair GIOR0, /GIOR0.

Sense amplifier control circuits SAC0–SAC3 receive column select signals CLER0–CLER3, respectively, and sense amplifier band SAG#0c receive column select signals CLOR0–CLOR3 corresponding to respective bit line pairs BL, /BL. While herein column select signals are only shown for a read operation, they are also applicable to a write operation and corresponding to column select signal CLER<3:0> column select signal CLEW<3:0> is input for the write operation and corresponding to column select signal CLOR<3:0> column select signal CLOW<3:0> is input for the write operation. Herein if bit line pair BL0, /BL0 is selected, column select signal CLER0 (of a high level) is input to read data. If bit line pair BL2, /BL2 is selected, column select signal CLER1 (of the high level) is input to read data.

FIG. 34 shows a circuit configuration of sense amplifier band SAG#0b performing a column select operation.

Sense amplifier band SAG#0b includes sense amplifier control circuits SAC0–SAC3 connected to a writing input/output line pair GIOW0 and /GIOW0 and a reading input/output line pair GIOR0 and /GIOR0 connected to a data input/output circuit communicating data.

Sense amplifier control circuit SAC0 will now be described. The other sense amplifier control circuits SACs have a similar circuit configuration and thus will not be described specifically.

Sense amplifier control circuit SAC0. includes N channel MOS transistors NL0 and /NL0, QW0 and/QW0, QRB0 and/QRB0, QRC0 and /QRC0, NR0 and /NR0, an equalizer EQ0, and a sense amplifier SA0.

N channel MOS transistors NL0 and /NL0, and NR0 and /NR0 are arranged as gate circuits for bit line pair BL0, /BL0 for memory blocks M0 and M1 respectively and turn on in response to gate select signals SHRL and SARR to select one of the gate circuits. Equalizer EQ0 is activated in response to an activation signal BLEQ to precharge bit line pair BL0, /BL0 connected to sense amplifier SA0 to transmit a data signal. Sense amplifier SA0 is activated in response to sense amplifier activation signals SE and /SE to amplify a signal received on bit line pair BL0, /BL0. N channel MOS transistors QW0 and /QW0 is a gate circuit electrically coupling bit line pair BL0, /BL0 and input/output line pair /GIOW0, GIOW0 together, respectively.

A write operation will now be described.

When column select signal CLEW0 attains a high level, N channel MOS transistors QW0 and /QW0 turn on and data on input/output line pair /GIOW0, GIOW0 is transmitted via sense amplifier SA0 to bit line pair BL0, /BL0, respectively, to write data.

A read operation will now be described.

N channel MOS transistors QRB0 and QRC0 are connected in series between input/output line /GIOR0 and a node N0 connected to ground voltage GND. N channel MOS transistors /QRB0 and /QRC0 are arranged in series between input/output line GIOR0 and node N0 connected to ground voltage GND. Furthermore, N channel MOS transistors QRB0, /QRB0 have their respective gates electrically connected to bit line pair BL0, /BL0, respectively, and N channel MOS transistors QRC0, /QRC0 have their respective gates both receiving column select signal CLER0.

When column select signal CLER0 attains a high level, N channel MOS transistors QRC0 and /QRC0 turn on. Then data on bit line pair BL0, /BL0 are transmitted to input/output line pair /GIOR0, GIOR0 to read data. When sense amplifier SA0 provides amplification, one of NMOS transistors QRB0 and /QRB0 turns on, and node N0 connected to ground voltage GND and one of input/output line pair GIOR0 and /GIOR0 are electrically connected to read data.

Similarly, when column select signal CLEW3 attains a high level, sense amplifier control circuit SAC3 is activated, and via sense amplifier SA3 and equalizer EQ3 bit line pair BL6, /BL6 receive data on input/output line pair /GIOW0, GIOW0, respectively, to write data. When column select signal CLER3 attains the high level, sense amplifier control circuit SAC3 is activated and data on bit line pair BL6, /BL6 are read onto input/output line pair /GIOW0, GIOW0. Other sense amplifier control circuits SAC1 and SAC2 similarly operate and thus will not be described specifically.

Again with reference to FIG. 28, the FIG. 28 memory cell array is configured of four memory banks #s each having four memory blocks. Each memory block and sense amplifier band SAG# have a relationship in the shared SA system as has been described previously.

Herein, although not shown in the figure, each memory bank has a connection, each with two sense amplifier bands SAG#s arranged, for example so that while memory bank#0 is activated, sense amplifier band SAG# of memory bank#1 can be activated simultaneously.

Thus for a single memory bank# the number of sense amplifier bands SAG#s is constantly equal to that of memory blocks plus one.

Sense amplifier band SAG# and bit line pair BL, /BL have a relationship therebetween, as follows: for memory bank#0, odd-numbered sense amplifier bands SAG#0b and SAG#0d receive a signal on column select lines CSLER<3:0> and CSLEW<3:0> selecting an even-numbered bit line pair, and even-numbered sense amplifier bands SAG#0a, SAG#0c and SAG#0e receive a signal on column select lines CSLOR<3:0> and CSLOW<3:0> selecting an odd-numbered bit line pair.

However, column select lines CSLER<3:0> and CSLEW<3:0> selecting an even-numbered bit line pair are responsible for a number of sense amplifier bands SAG#0 and column select lines CSLOR<3:0> and CSLOW<3:0> selecting an odd-numbered bit line pair are responsible for a different number of sense amplifier bands SAG#0, and accordingly there is introduced a difference in load of two to three per memory bank#. For a 4-memory bank# configuration there would be introduced a difference in load of 8:12. Thus a column select signal is transmitted at a different timing disadvantageously to prevent a rapid operation of a column cycle.

SUMMARY OF THE INVENTION

The present invention has been made to overcome the disadvantage described above and it contemplates reducing a difference in timing associated with that in load, and thus providing a faster column-related operation.

The present invention provides a semiconductor memory device including: first and second memory banks each including M memory blocks each divided into first and second memory regions, M representing an even number of no less than two, and (M+1) sense amplifier bands each inputting and outputting data to and from one of the first and second memory regions in at least one, adjacent memory block of the M memory blocks, the M memory blocks being each arranged between adjacent two of the (M+1) sense amplifier bands; a first select line activated when the first memory region is selected; and a second select line activated when the second memory region is selected, the first memory bank having odd-numbered ones of the (M+1) sense amplifier bands each coupled with the first select line to input and output the data to and from the first memory region, and even-numbered ones of the (M+1) sense amplifier bands each coupled with the second select line to input and output the data to and from the second memory region, the second memory bank having odd-numbered ones of the (M+1) sense amplifier bands each coupled with the second select line to input and output the data to and from the second memory region, and even-numbered ones of the (M+1) sense amplifier bands each coupled with the first select line to input and output the data to and from the first memory region.

Thus in the present semiconductor memory device the first select line is responsible for activating in the first and second memory banks odd-and even-numbered sense amplifier bands, respectively, of (M+1) sense amplifier bands arranged on opposite sides of M memory blocks including in each of the first and second memory banks and the second select line is responsible for activating in the first and second memory banks even- and odd-numbered sense amplifier bands, respectively, of the (+1) sense amplifier bands to allow the first and second select lines to be uniform in load and thus eliminate a difference in timing between the first and second select lines to provide a faster column-related operation.

Preferably, the M memory blocks each having a plurality of memory cells arranged in rows and columns to hold data, a plurality of bit lines provided to correspond to the rows of the memory cells, respectively, and a plurality of word lines provided to correspond to the columns of the memory cells, respectively, the semiconductor memory device further comprising an input/output line arranged parallel to the plurality of bit lines and connected to each of the (M+1) sense amplifier bands, wherein the first and second select lines traverse the plurality of bit lines.

In the present semiconductor device an input/output line can be arranged parallel to a bit line and a select line can be arranged to traverse the bit line to reduce a layout area.

Preferably the semiconductor memory device further includes a column select circuit connected to the first and second select lines, wherein the first and second select lines transmit a decoded select signal from the column select circuit.

The present invention provides a semiconductor device including: a plurality of memory banks each including M memory blocks each having a plurality of memory cells in rows and columns and divided into first and second memory blocks having an equal number of columns of memory cells, M representing an even number of no less than two, each the memory bank also including (M+1) sense amplifier bands each inputting and outputting data to and from one of the first and second memory regions in at least one adjacent memory block of the M memory blocks, the M blocks being each arranged between adjacent two of the (M+1) sense amplifier bands, the plurality of memory banks each having odd-numbered ones of the (M+1) sense amplifier bands each inputting and outputting the data to and from the first memory region, and even-numbered ones of the (M+1) sense amplifier bands inputting and outputting the data to and from second memory region; a predecode circuit generating a first select signal selecting one of the first and second memory regions and a second select signal selecting a column of memory cells in each of the first and second memory regions; a column select signal line transmitting the second select signal; and (M+1) decode circuits arranged to correspond to the (M+1) sense amplifier bands, respectively, in each of the plurality of memory banks, each operative in response to the first and second select signals to select one of the corresponding columns of memory cells, the (M+1) decode circuit being each as connected to the column select signal line.

Preferably the semiconductor memory device further includes a first select line transmitting the first select signal, wherein the (M+1) decode circuits are each further connected to the first select line.

In the present semiconductor device there are provided a column select signal line selecting a column of a memory block, and a first select line transmitting a first select signal selecting one of the first and second memory regions, connected to (M+1) sense amplifier bands arranged on opposite sides of M memory blocks included in each of a plurality of memory banks, to provide a uniform load and hence a faster column-related operation.

In particular, the first select line includes a first region select line transmitting a first region select signal and a second region select line transmitting a second region select signal, the first and second region select signals selecting the first and second memory regions, respectively, and the odd-numbered ones of the (X+1) decode circuits are each connected to the first region select line, and the even-numbered ones of the (M+1) decode circuits are each connected to the second region select line.

In the present semiconductor memory device the first select line includes a first region select line selecting a first region and a second region select line selecting a second region and can connect each odd-numbered one of the (M+1) decode circuits and the first region select line together and connect each even-numbered one of the (M+1) decode circuits and the second region select line together to achieve a uniform load to provide a faster column-related operation.

Preferably, the semiconductor device further includes a first select line transmitting the first select signal, wherein: the column select signal line includes a plurality of subordinate column select signal lines corresponding to the plurality of memory banks respectively; and the (M+1) decode circuits are each connected to a corresponding one of the plurality of subordinate column select signal lines and further to the first select line.

In the present semiconductor memory device a plurality of memory banks each include M memory blocks sandwiched by (M+1) sense amplifier bands connected to a subordinate column select signal line selecting a column of a memory block that is provided to correspond to each memory bank to reduce a load and thus achieve a further faster, column-related operation.

In particular, the first select line includes a first region select line transmitting a first region select signal and a second region select line transmitting a second region select signal, the first and second region select signals selecting the first and second memory regions, respectively, and the odd-numbered ones of the (M+1) decode circuits are each connected to the first region select line and the even-numbered ones of the (M+1) decode circuits are each connected to the second region select line.

In the present semiconductor device, first and second region select lines can be provided to select first and second regions, respectively, of a memory block and of (M+1) decode circuits an odd-numbered decode circuit and the first region select line can be connected together and an odd-numbered decode circuit and the second region select line can be connected together to achieve a uniform load and thus provide a faster column-related operation.

The present invention provides a semiconductor memory device including: a plurality of memory banks each including M memory blocks each having a plurality of memory cells in rows and columns and a plurality of bit line provided to respectively correspond to the columns of the memory cells, M representing an even number of no less than two, the M memory blocks being each divided into first and second memory regions each having an equal number of the columns of the memory cells, the plurality of memory banks each further including (M+1) sense amplifier bands each inputting and outputting data to and from one of the first and second memory regions in at least one, adjacent memory block of the M memory blocks, the M blocks being each arranged between adjacent two of the (M+1) sense amplifier bands, the plurality of memory banks each having odd-numbered ones of the (M+1) sense amplifier bands each inputting and outputting the data to and from the first memory region and even-numbered ones of the (M+1) sense amplifier bands each inputting and outputting the data to and from the second memory region; a plurality of first decode circuits arranged to correspond to the odd-numbered sense amplifier bands, respectively, and each operative to effect a column select operation; a plurality of second decode circuits arranged to correspond to the even-numbered sense amplifier bands, respectively, and each operative to effect a column select operation; a plurality of first select lines provided to correspond to the plurality of first decode circuits, respectively, and each transmitting a first select signal to effect the column select operation in the first memory region corresponding thereto; and a plurality of second select lines provided to correspond to the plurality of second decode circuits, respectively, and each transmitting a second select signal to effect a column select operation in the second memory region corresponding thereto.

In the present semiconductor device a first select line selecting a column of an odd-numbered sense amplifier band of a memory block and a second select line selecting a column of an even-numbered sense amplifier band of a memory block can be connected to each sense amplifier band for each memory block of each memory bank to provide a uniform load and reduce a difference in timing between the first and second select lines and also to reduce a load to provide a faster, column-related operation.

The present invention provides a semiconductor memory device including: a plurality of memory banks each including M memory blocks each having a plurality of memory cells in rows and columns and a plurality of bit line provided to respectively correspond to the columns of the memory cells, M representing an even number of no. less than two, the M memory blocks being each divided into first and second memory regions each having an equal number of the columns of the memory cells, the plurality of memory banks each further including (M+1) sense amplifier bands each inputting and outputting data to and from one of the first and second memory regions in at least one, adjacent memory block of the M memory blocks, the M blocks being each arranged between adjacent two of the (M+1) sense amplifier bands, the plurality of memory banks each having odd-numbered ones of the (M+1) sense amplifier bands each inputting and outputting the data to and from the first memory region and even-numbered ones of the (M+1) sense amplifier bands each inputting and outputting the data to and from the second memory region; a plurality of first decode circuits arranged to correspond to the odd-numbered sense amplifier bands, respectively, and each operative to effect a column select operation; a plurality of second decode circuits arranged to correspond to the even-numbered sense amplifier bands, respectively, and each operative to effect a column select operation; a first select line connected to each the first decode circuit to transmit a first select signal to effect the column select operation in the first memory region; a second select line connected to each the second decode circuit to transmit a second select signal to effect the column select operation in the second memory region; and a delay load circuit provided for one of the first and second select lines to delay signal propagation on one of the first and second select lines for a predetermined period of time.

In the present semiconductor memory device a first select line selecting a column of an odd-numbered sense amplifier band of a memory block and a second select line selecting a column of an even-numbered sense amplifier band of a memory block can be shared by each memory bank and connected to their respective sense amplifier bands and one of the first and second select lines can be connected to a delay load circuit to allow the first and second select lines to be uniform in load and eliminate a difference in timing between the first and second select lines to achieve a faster, column-related operation.

Preferably the delay load circuit has one of an inverter and an NAND circuit.

In the present semiconductor memory device the delay load circuit can be configured by an inverter or a NAND circuit and it can thus be simplified in configuration.

The present invention provides a semiconductor memory device including: a plurality of memory banks each including M memory blocks each having a plurality of memory cells in rows and columns and a plurality of bit line provided to respectively correspond to the columns of the memory cells, M representing an even number of no less than two, the M memory blocks being each divided into first and second memory regions each having an equal number of the columns of the memory cells, the plurality of memory banks each further including (M+1) sense amplifier bands each inputting and outputting data to and from one of the first and second memory regions in at least one, adjacent memory block of the M memory blocks, the M blocks being each arranged between adjacent two of the (+1) sense amplifier bands, the plurality of memory banks each having odd-numbered ones of the (M+1) sense amplifier bands each inputting and outputting the data to and from the first memory region and even-numbered ones of the (M+1) sense amplifier bands each inputting and outputting the data to and from the second memory region; a plurality of first decode circuits arranged to correspond to the odd-numbered sense amplifier bands, respectively, and each operative to effect a column select operation; a plurality of second decode circuits arranged to correspond to the even-numbered sense amplifier bands, respectively, and each operative to effect a column select operation; a first local select line connected to each the first decode circuit to transmit a first select signal to effect the column select operation in the first memory region; a second local select line connected to each the second decode circuit to transmit a second select signal to effect the column select operation in the second memory region; a first main select line shared by the plurality of memory banks and transmitting the first select signal; a second main select line shared by the plurality of memory banks and transmitting the second select signal; a first signal transmission transmitting the first select signal from the first main select line to the first local select line; and a second signal transmission transmitting the second select signal from the second main select line to the second local select line.

In the present semiconductor memory device, memory banks shares a first main select line, a second main select line, a first local select line transmitting a first select signal from the first main select line and a second local select line transmitting a second select signal from the second main select line and the first and second local select lines and each memory bank's odd- and even-numbered decode circuits can respectively be connected together to eliminate a difference in timing between the first and second local select lines and thus provide a faster, column-related operation.

Preferably, the first local select line includes a plurality of first subordinate local select lines corresponding to each of the plurality of memory banks, second local select line includes a plurality of second subordinate local select lines corresponding to each of the plurality of memory banks, and in each of the plurality of memory banks, each the first decode circuit is connected to a corresponding one of the plurality of first subordinate local select lines and each the second decode circuit is connected to a corresponding one of the plurality of second subordinate local select lines.

In the present semiconductor memory device a first local select line can include a plurality of first subordinate local select lines and a second local select line can include a plurality of second subordinate local select lines, and the first decode circuit in each memory bank and a corresponding first subordinate local select line can be connected together and the second decode circuit in each memory bank and a corresponding second subordinate local select line can be connected together to eliminate a difference in timing between the first and second subordinate local select lines and thus provide a faster, column-related operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
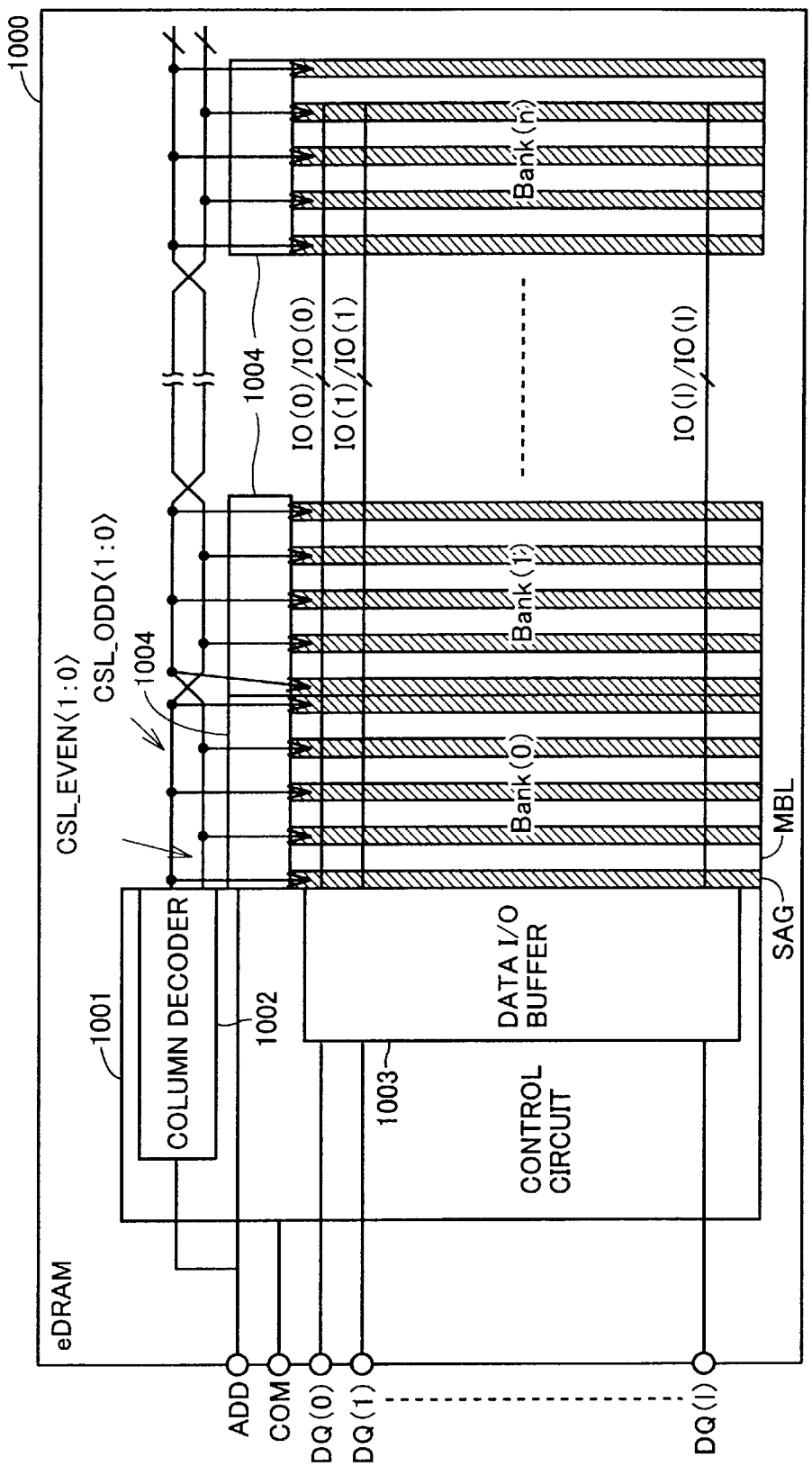
FIG. 1 shows a circuit configuration 1000 of a multiinput/output and multibank, logic embedded DRAM.

The embodiments of the present invention will now be described specifically with reference to the drawings. In the figures, like components are denoted by like reference characters.

First Embodiment

With reference to FIG. 1, an eDRAM 1000 includes a control circuit 1001, a column decoder 1002, a data input/output buffer 1003, a row decoder 1004, memory banks Bank(0)-Bank(n), hereinafter generally referred to as a memory bank Bank, wherein n represents a natural number, column select lines CSL_ODD<1:0> and CSL_EVEN<1:0> shared by all memory banks to transmit a column select signal, input/output line pairs IO(0), /IO(0) to IO(1), /IO(1), wherein 1 represents a natural number, an address pin ADD, a command pin COM, and input/output terminals DQ(0)–DQ(1), hereinafter generally referred to as an input/output terminal DQ.

Each memory bank Bank includes a plurality of memory blocks MBLs and a plurality of sense amplifier band SAG on opposite sides of each memory block MBL. In each memory block MBL, word lines and bit lines are arranged to correspond to rows and columns, respectively, and a memory cell storing data is arranged to correspond to each word line and each bit line.

Control circuit 1001 generally controls eDRAM 1000 and it includes column decoder 1002 and data input/output buffer 1003 and also controls row decoder 1004. Column decoder 1002 selects a bit line and it receives an address signal through address pin ADD and transmits to column select lines CSL_ODD<1:0> and CSL_EVEN<1:0> a signal indicating that a column be selected. Data input/output buffer 1003 is arranged between each input/output terminal DQ and each input/output line pair IO and /IO to communicate data. Row decoder 1004 is arranged for each memory bank Bank to select a word line. Each input/output line pair IO, /IO is arranged orthogonal to each memory bank Bank.

Figure 2A:
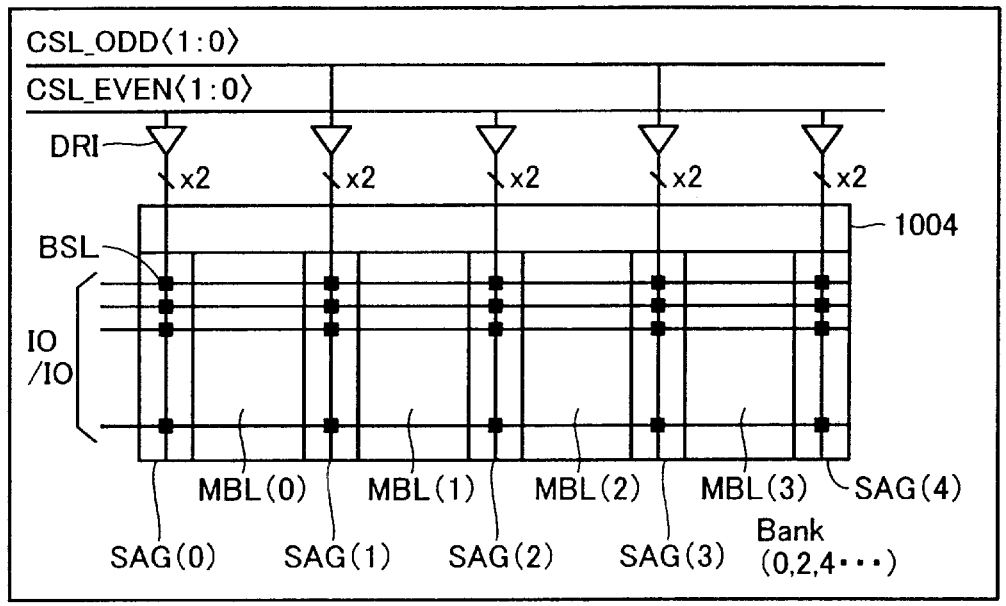
FIGS. 2A and 2B show odd- and even-numbered memory banks Banks.
Figure 2B:
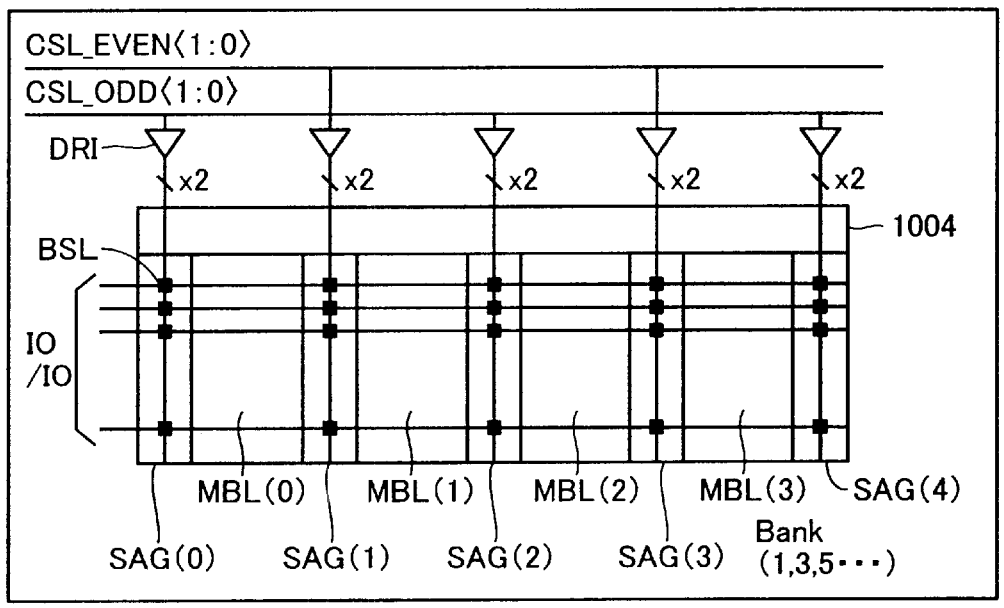

FIG. 2A shows an even-numbered memory bank Bank (e.g., memory bank Bank(0)) and FIG. 2B shows an odd-numbered memory bank Bank (e.g., a memory bank Bank (1)).

Figure 24:
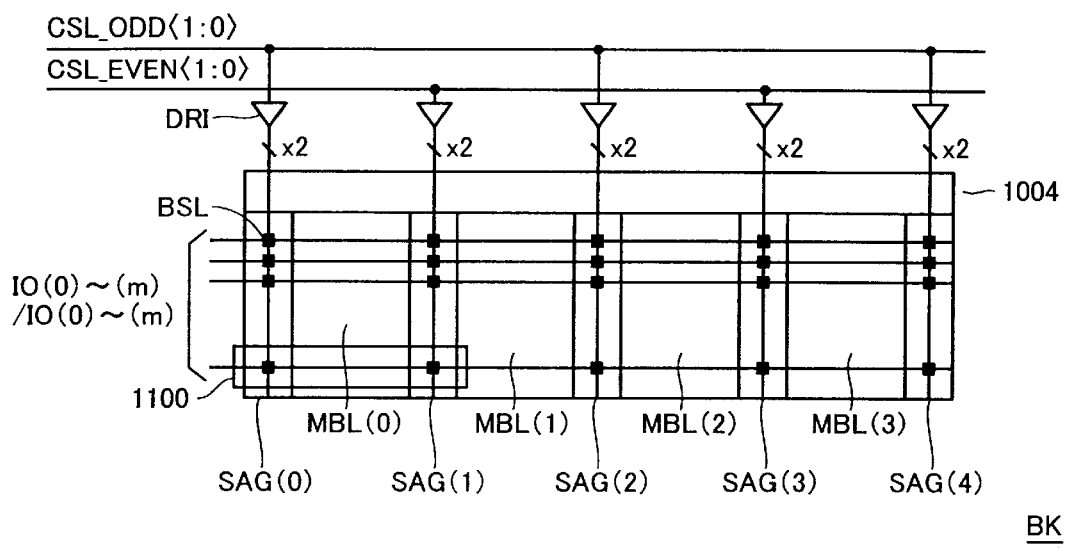
FIG. 24 represents a relationship between a memory bank BK and column select lines CSL_ODD<1:0> and CSL_EVEN<1:0>.
Figure 25:
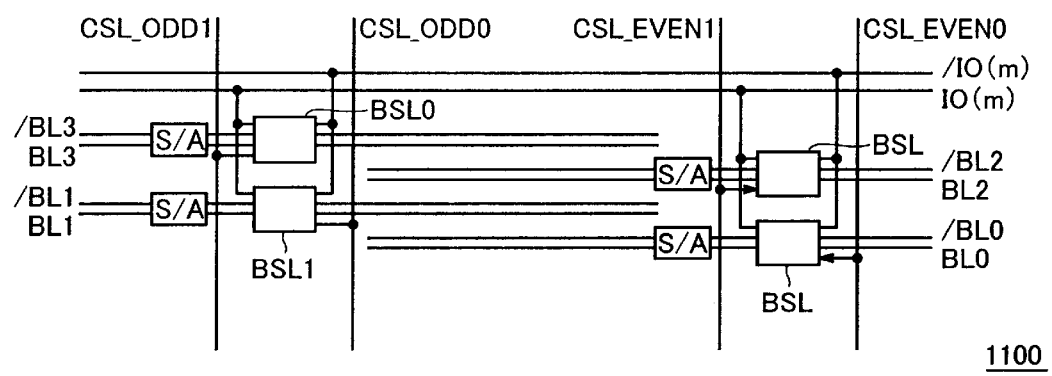
FIG. 25 shows a circuit configuration of a sense amplifier block 1100.
Figure 26:
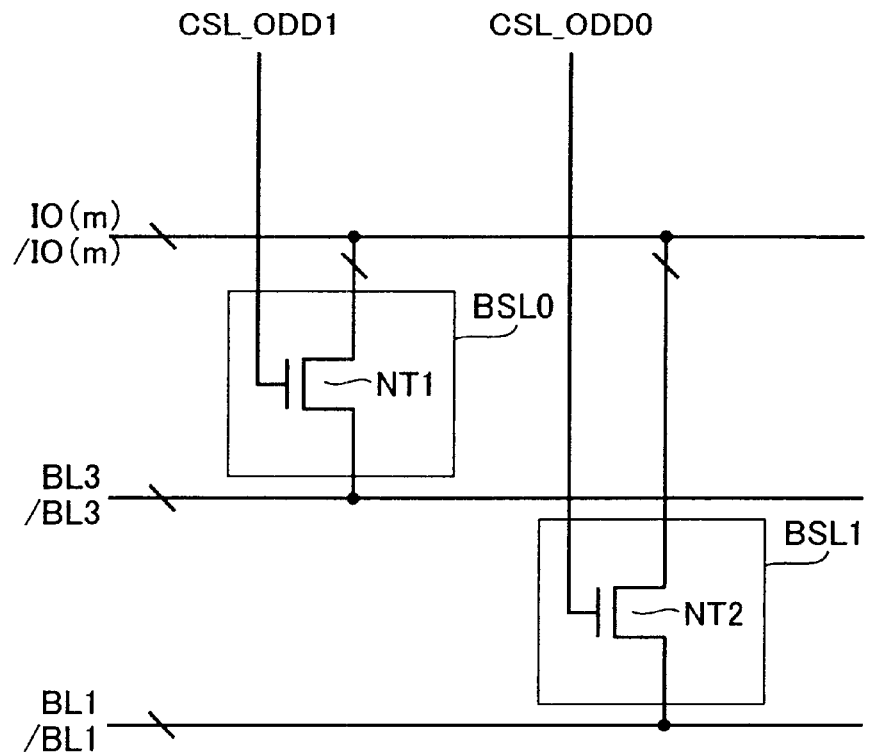
FIG. 26 shows a circuit configuration of bit line select circuits BSL0 and BSL1.
Figure 27:
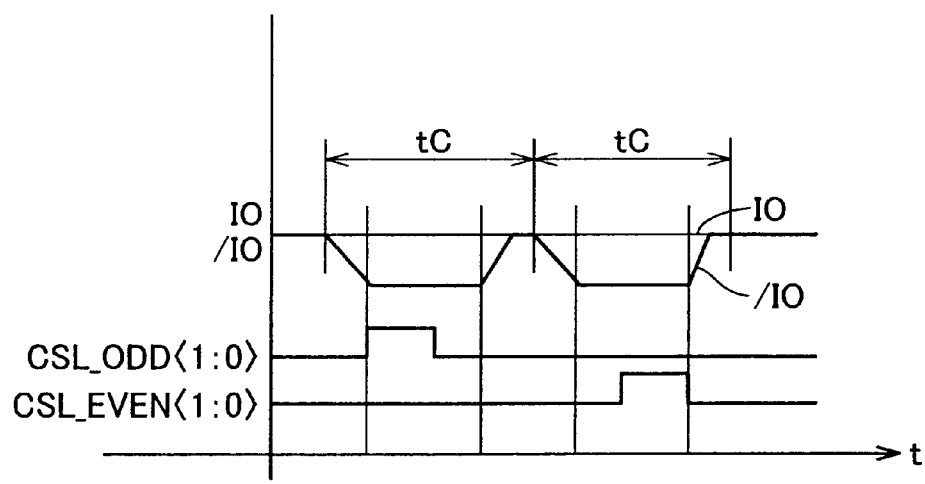
FIG. 27 is timing plots representing a write operation.

Each memory bank Bank has a circuit configuration similar to that described with reference to FIG. 24 and thus will not be described specifically.

The FIG. 2A memory bank Bank differs from the FIG. 2B memory bank Bank in that column select lines CSL_ODD and CSL_EVEN are switched in arrangement.

More specifically, for the FIG. 2A memory bank Bank, column select line CSL_ODD is connected to two drivers DRIs each providing an input to sense amplifier band SAG and column select line CSL_EVEN is connected to three drivers DRIs each providing an input to sense amplifier band SAG, whereas for the FIG. 2B odd-numbered memory bank Bank, the former column select line is connected to three drivers DRIs and the latter column select line is connected to two drivers DRIs. Thus, the difference in load for the entire memory bank Bank including even- and odd-numbered memory banks Banks, is smaller than the conventional example before it has the column select lines are switched in arrangement.

Figure 3:
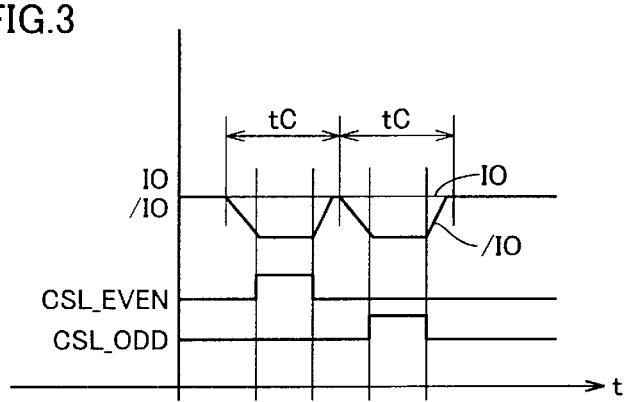
FIG. 3 is timing plots representing a write operation in a first embodiment of the present invention.

Conventionally signals of column select lines CSL_EVEN and CSL_ODD are offset in timing and input/output line pair IO, /IO is driven for a long period of time. With reference to FIG. 3, in the first embodiment of the present invention, the signals of the column select lines are not offset in timing. This can eliminate the necessity of driving input/output line pair IO, /IO for a long period of time and as a result a column cycle (tC) can be reduced to provide a faster column-related operation.

Second Embodiment

A second embodiment of the present invention relates to an eDRAM 10000 providing a different column selection than eDRAM 1000 of the first embodiment. The present embodiment contemplates a faster column-related operation for an eDRAM 10000.

Figure 4:
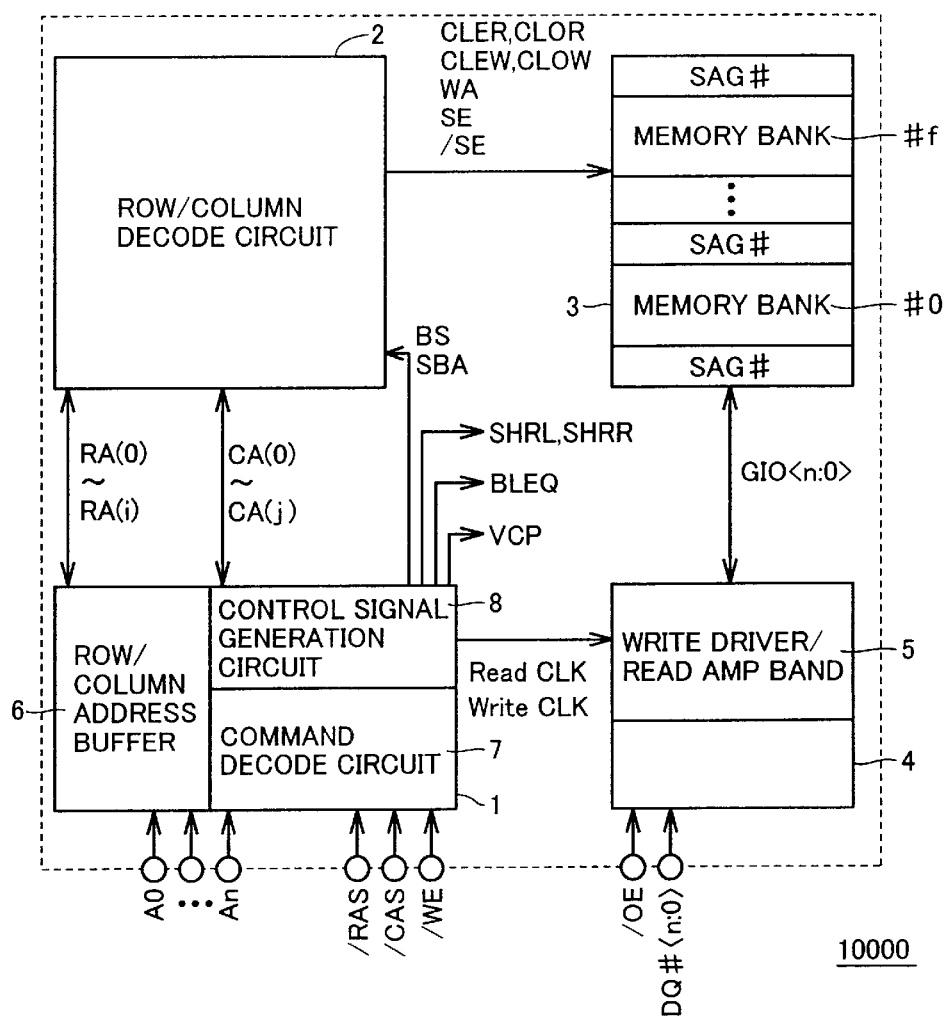
FIG. 4 schematically shows a DRAM 10000.

With reference to FIG. 4, eDRAM 10000 includes a control circuit 1, a row/column decode circuit 2, a memory unit 3 and a data input/output circuit 4.

Control circuit 1 generally controls eDRAM 10000 and also generates a command signal output to each circuit. Control circuit 1 includes a row/column address buffer 6, a command decode circuit 7 and a control signal generation circuit 8. Row/column address buffer 6 receives an address signal input through address terminals A(0)–A(n), wherein n is a natural number, and row/column address buffer 6 outputs to row/column decode circuit 2 row addresses RA(0)–RA(i) (hereinafter generally referred to as a row address RA) and column addresses CA(0)–CA(j) (hereinafter generally referred to as a column address), wherein i and j are each a natural number.

Command decode circuit 7 receives an external signal input through a command terminal such as /RAS, /CA, /WE and the like and outputs a decoded command signal to each circuit. Control signal generation circuit 8 generates a select signal for block select line BS and that for bank select line SAB and also generates gate select signals SHRL and SHRR, an equalizer activation signal BLEQ, a cell plate signal VCP, and clock signals Read. CLK exclusively for a read operation and a clock signal Write. CLK exclusively for a write operation. Row/column decode circuit 2 receives row address RA and column address CA from control circuit 1 and for a row-related signal generates a word line select signal WA and sense amplifier activation signals SE and /SE for output to memory unit 3.

For a column-related signal, row/column decode circuit 2 generates reading and writing column select signals CLER and CLEW and CLOR and CLOW for output to memory unit 3. Memory unit 3 includes a plurality of memory banks #0–#f (hereinafter generally referred to as a memory bank#), wherein f represents a natural number, and each memory bank# is arranged between each sense amplifier bands SAG#. Data input/output circuit 4 operates receiving a signal through an input/output terminal DQ#<n:0> and an input/output enable signal /OE and communicates data with memory unit 3 on an input/output bus GIO<n:0> including a writing input/output line pair GIOW<n:0>, /GIOW<n:0> and a reading input/output line pair GIOR<n:0>, /GIOR<n:0>. Data input/output circuit 4 includes an input/output control circuit having a write driver and a read amplifier band and it receives control signals Read. CLK and Write. CLK to control communication of data with memory unit 3 in read and write operations.

The present invention provides a circuit configuration, as will now be described hereinafter specifically. Note that while the circuit of the present invention in this description is based on a configuration with read and write operations separated, it is also applicable to a configuration without read and write operations separated. Furthermore while in the conventional art a memory block has been described as having an 8-bit configuration and in the following description it is also described as having the 8-bit configuration, it may of course be of a configuration of n2 bits equal to or greater than eight bits, wherein n2 represents a natural number.

Herein a description will be provided for memory banks #0–#3 representatively. Each of memory banks #4–#f has a circuit configuration similar to that described with reference to FIG. 5 and thus will not be described.

Figure 5:
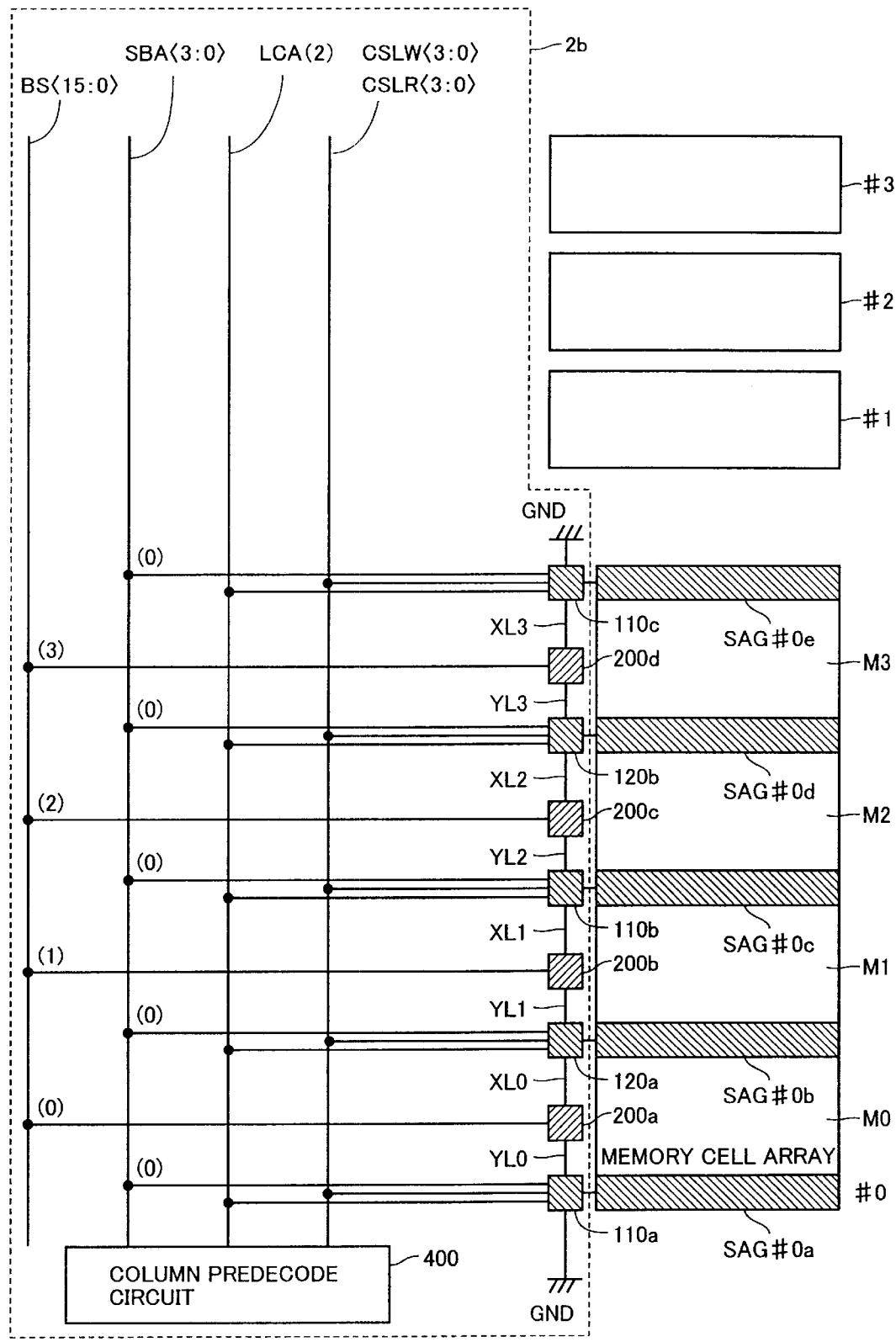
FIG. 5 shows a circuit configuration of a column decode circuit 2*b* included in a row/column decode circuit 2.
Figure 28:
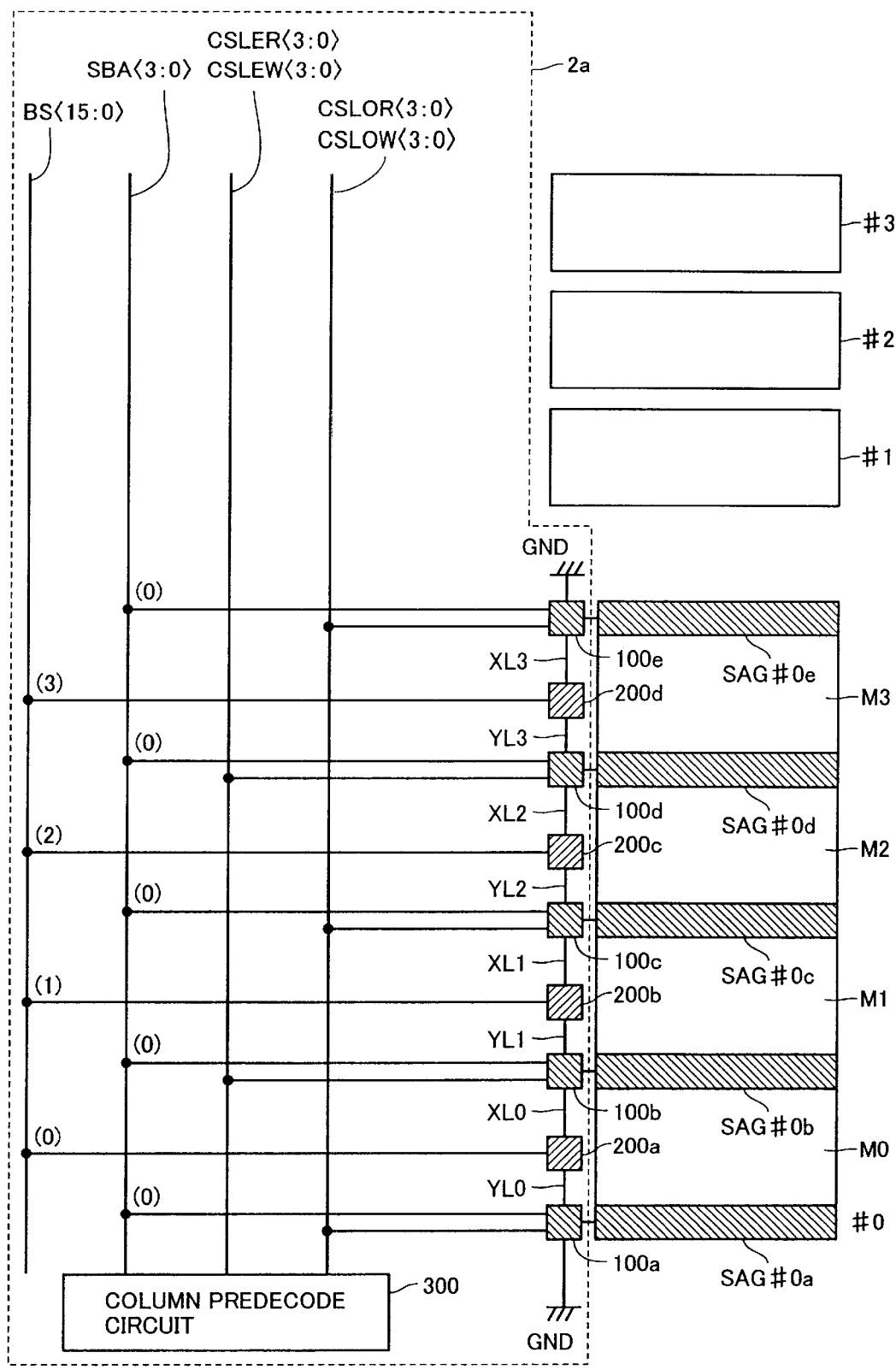
FIG. 28 schematically shows memory banks #0–#3 and column decode circuit 2*a*.

FIG. 5 is different from the FIG. 28 column decode circuit 2a in that column select line CSL0R<3:0> and CSL0W<3:0> shared by all memory banks and selecting an odd-numbered bit line pair, and column select lines CSLER<3:0> and CSLEW<3:0> shared by all memory banks and selecting an even-numbered bit line pair are provided in the form of common column select lines CSLW<3:0> and CSLR<3:0> shared by all memory banks, that a column address signal line LCA(2) is provided to transmit a column address CA(2), and that CSL decode circuits 100a–100e are replaced with CSL decode circuits 110a–110c and 120a and 120b.

Memory blocks M0–M3 and sense amplifier bands SAG#0a–SAG#0e are similar to those described with reference to FIG. 28 and thus will not be described specifically.

Figure 6:
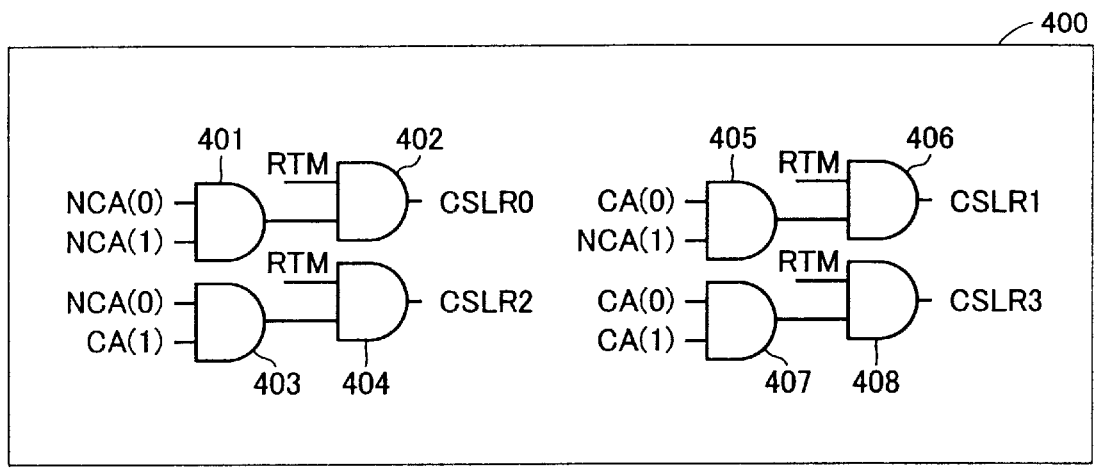
FIG. 6 shows a circuit configuration of a column predecode circuit 400.
Figure 29:
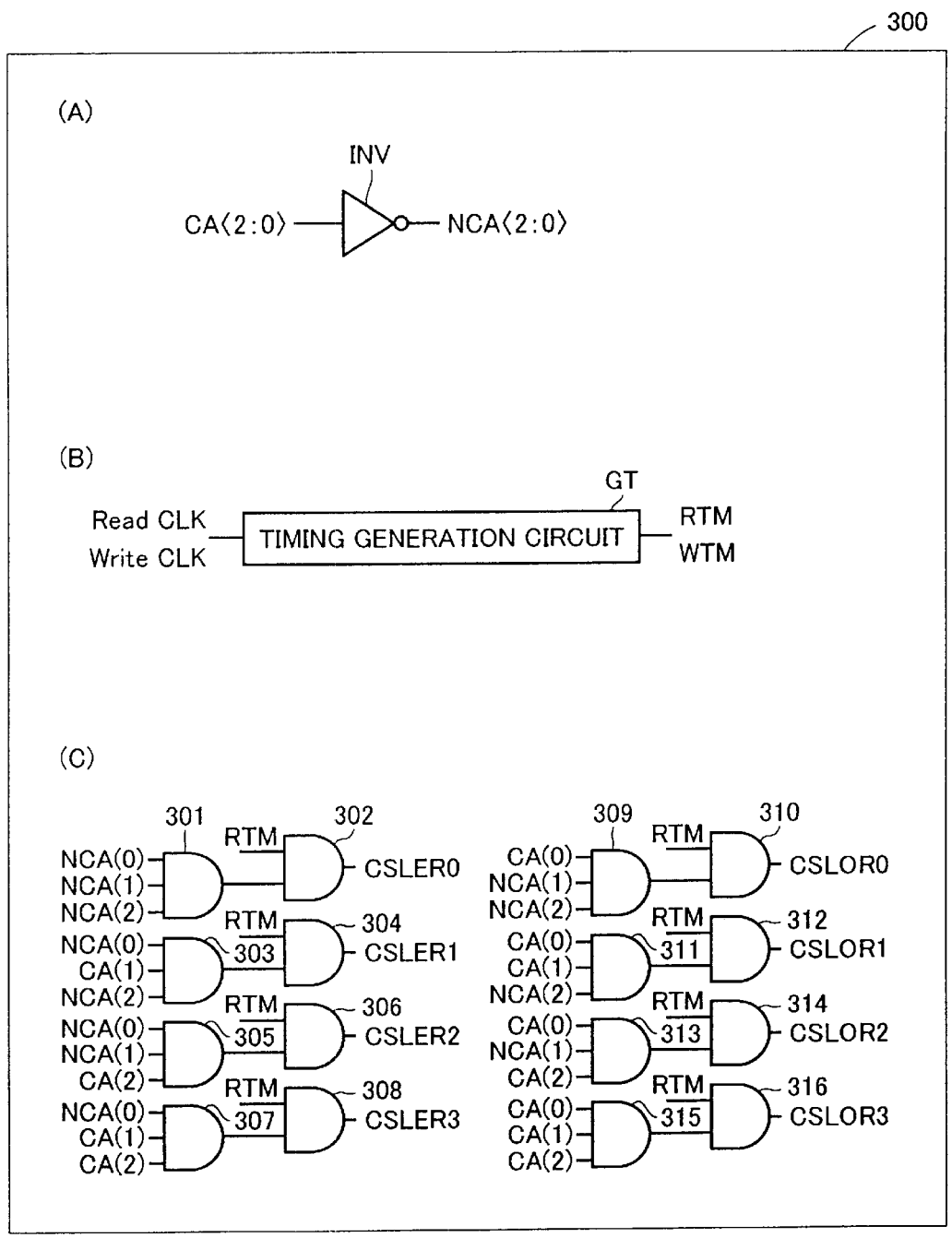
FIG. 29 shows a circuit configuration of a column pre-decode circuit 300.
Figure 30:
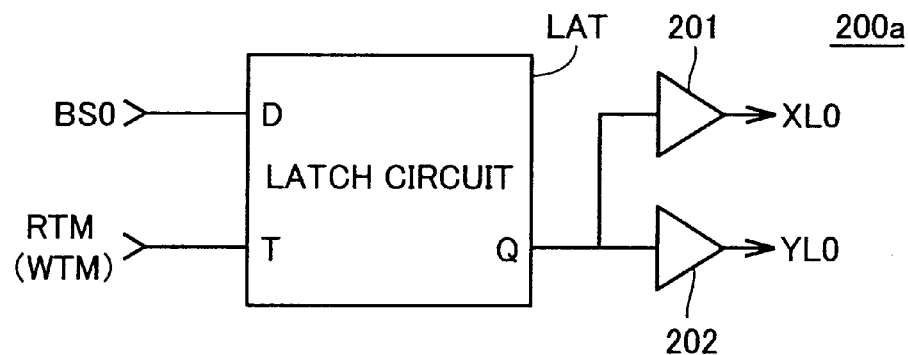
FIG. 30 shows a circuit configuration of a block select latch circuit 200*a*.
Figure 31:
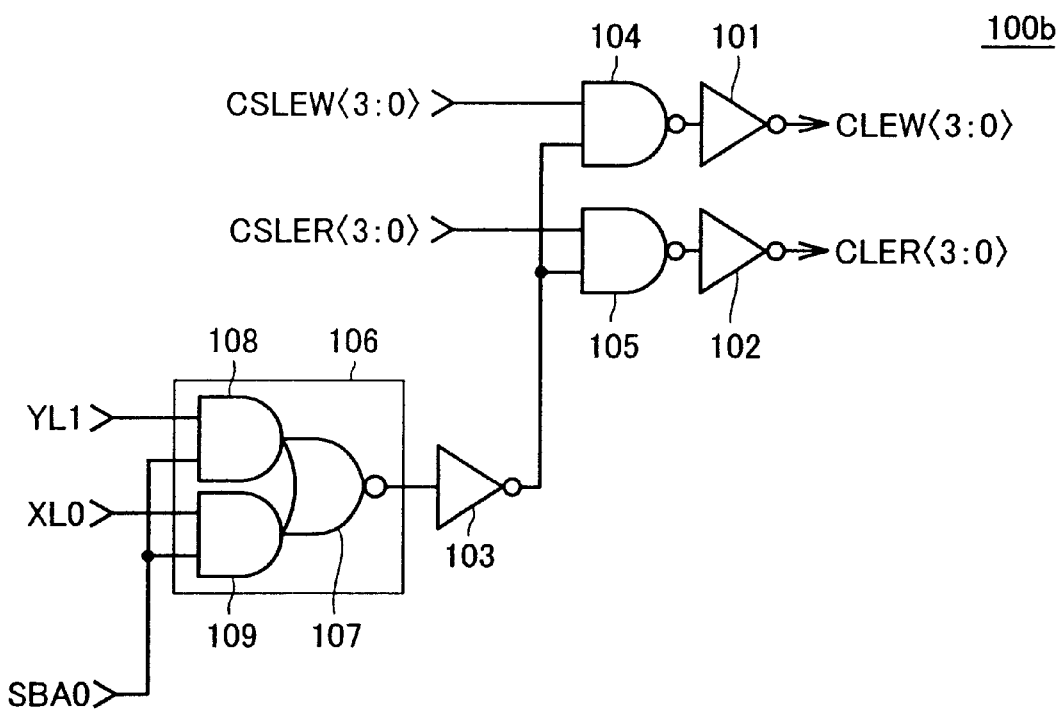
FIG. 31 shows a circuit configuration of a CSL decode circuit 100*b*.
Figure 32:
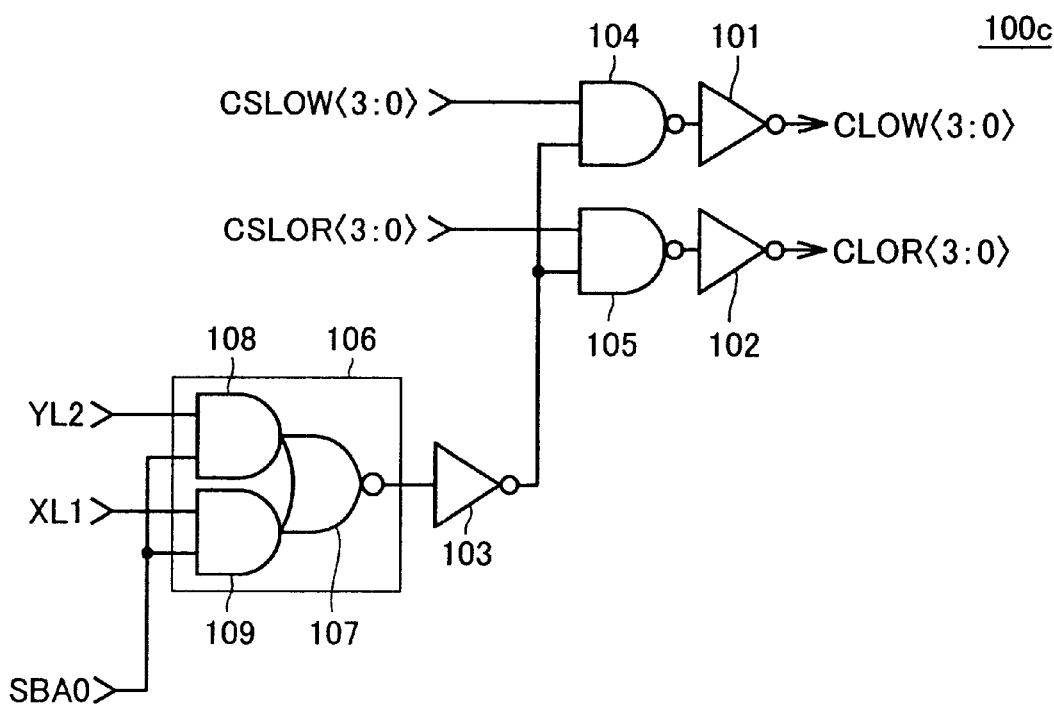
FIG. 32 shows a circuit configuration of a CSL decode circuit 100*c* connected to an even-numbered sense amplifier band SAG#0*c*.
Figure 33:
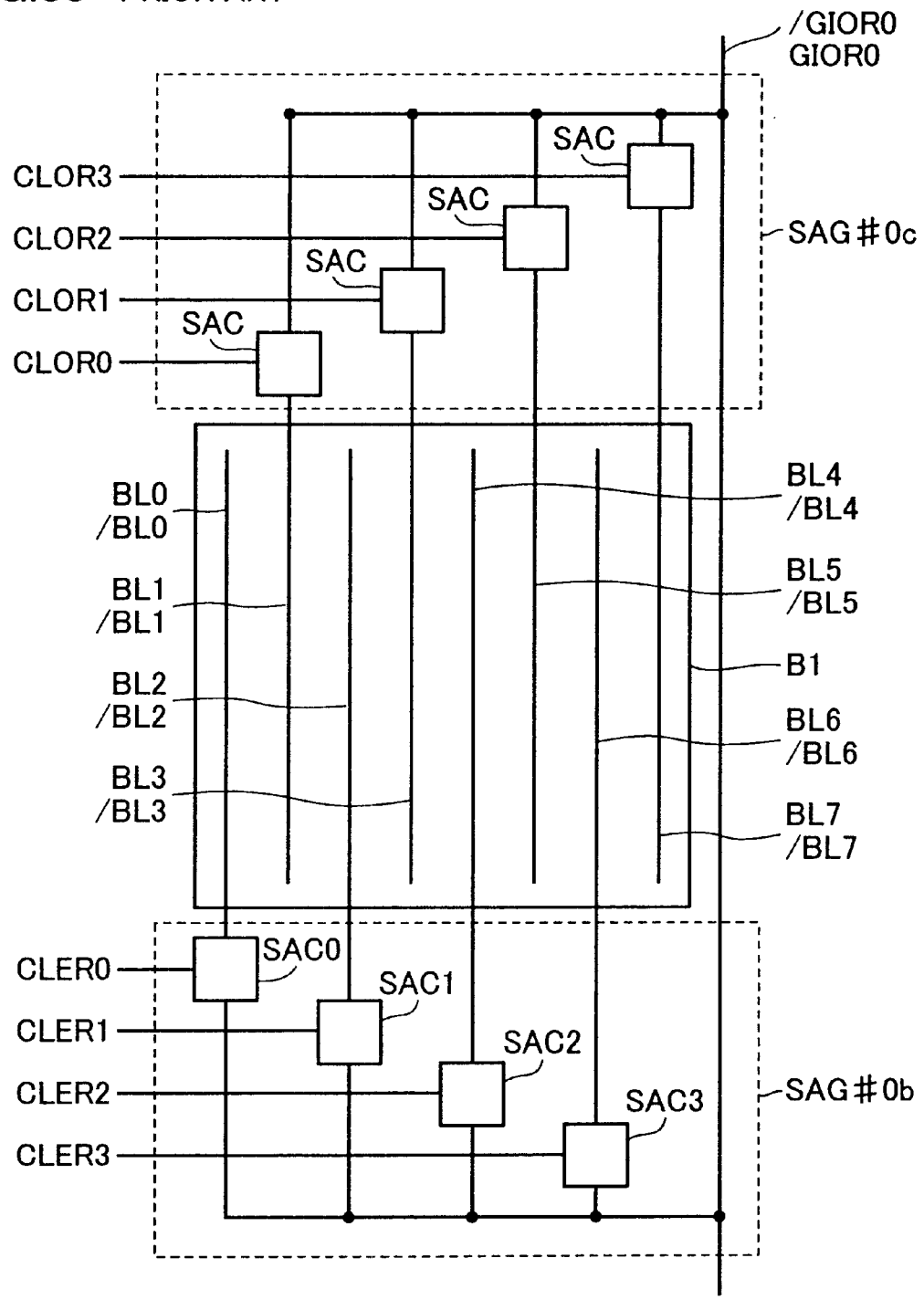
FIG. 33 represents a relationship of bit line pair BL, /BL for sense amplifier bands SAG#0*b* and SAG#0*c* arranged on opposite sides of a memory cell array 11.
Figure 34:
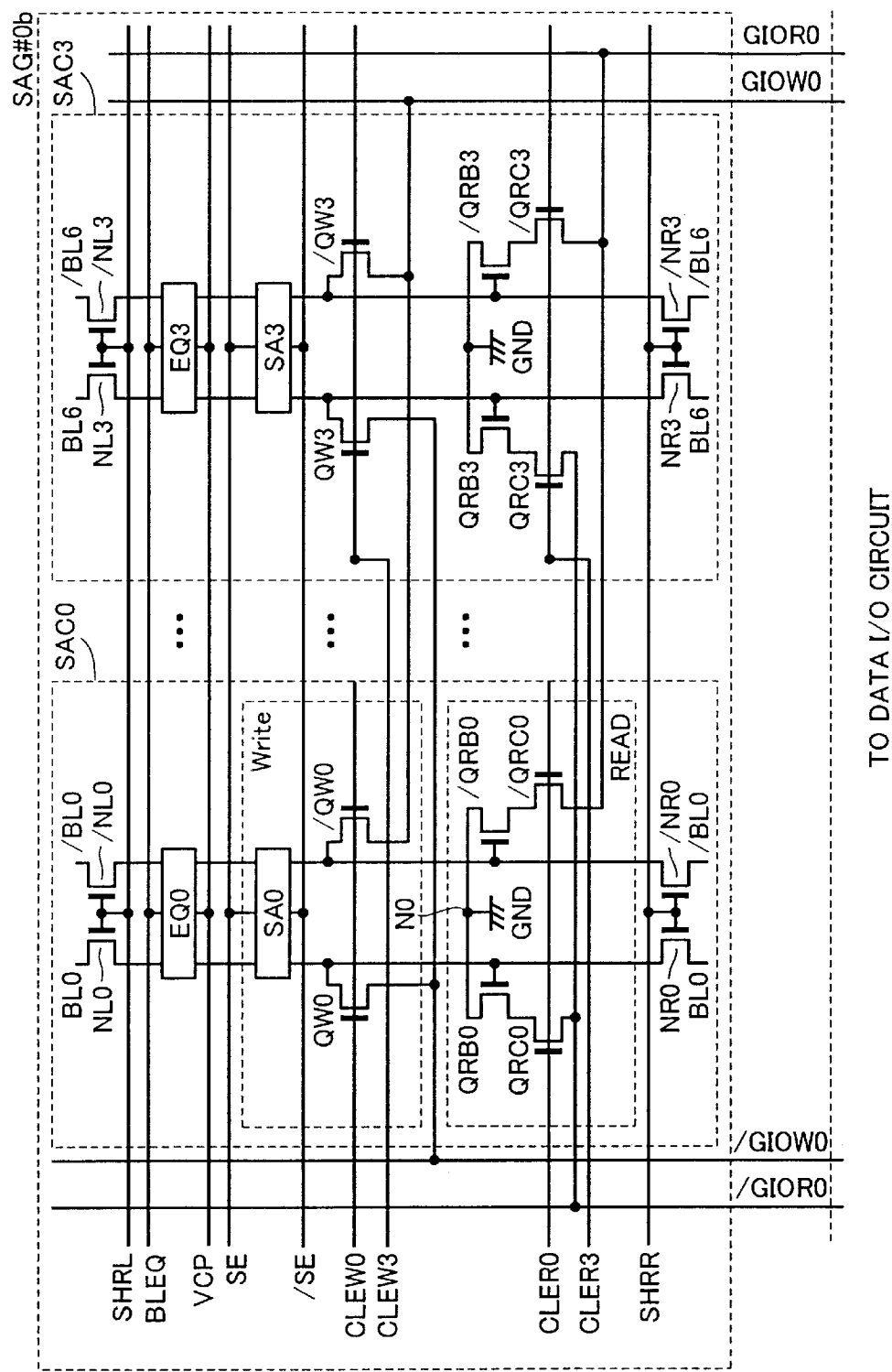
FIG. 34 shows a circuit configuration of sense amplifier band SAG#0*b*.

With reference to FIG. 6, column address NCA<1:0> is a signal corresponding to column address CA<1:0> that is inverted by inverter INV, as has been described with reference to FIGS. 29A–29C. Furthermore, in response to clock signals Read. CLK and Write. CLK exclusively for read and write operations, respectively, a timing generation circuit GT generates timing signals RTM and WTM.

While herein is described a configuration for a data read operation, it is similarly applied to a data write operation and thus will not be described specifically. FIG. 6 is different from the FIG. 28 column predecode circuit 300 in that in the former, column address CA(2) is not input.

An AND circuit 401 receive column addresses NCA(0) and NCA(1), performs a logical operation thereon and outputs the result of the operation to an AND circuit 402, and AND circuit 402 receives timing signal RTM and the output of AND circuit 401, performs a logical operation thereon and transmits the result of the operation to column select line CSLR0. An AND circuit 403 receives column addresses NCA(0) and CA(1), performs a logical operation thereon and outputs the result of the operation to an AND circuit 404, and AND circuit 404 receives timing signal RTM and the output of AND circuit 403, performs a logical operation thereon and transmits the result of the operation to column select line CSLR2.

An AND circuit 405 receives column addresses CA(0) and NCA(1), performs a logical operation thereon and outputs the result of the operation to an AND circuit 406, and AND circuit 406 receives timing signal RTM and the output of AND circuit 405, performs a logical operation thereon and transmits the result of the operation to column select line CSLR1. An AND circuit 407 receives column addresses CA(0) and CA(1) performs a logical operation thereon and outputs the result of the operation to an AND circuit 408, and AND circuit 408 receives timing signal RTM and the output of AND circuit 407, performs a logical operation thereon and transmits the result of the operation to column select line CSLR3.

For example, if timing signal RTM, column addresses NCA(0) and NCA(1) have a high level, column select line CSLR0 is activated and thus attain a high level to select a column to read data.

Figure 7:
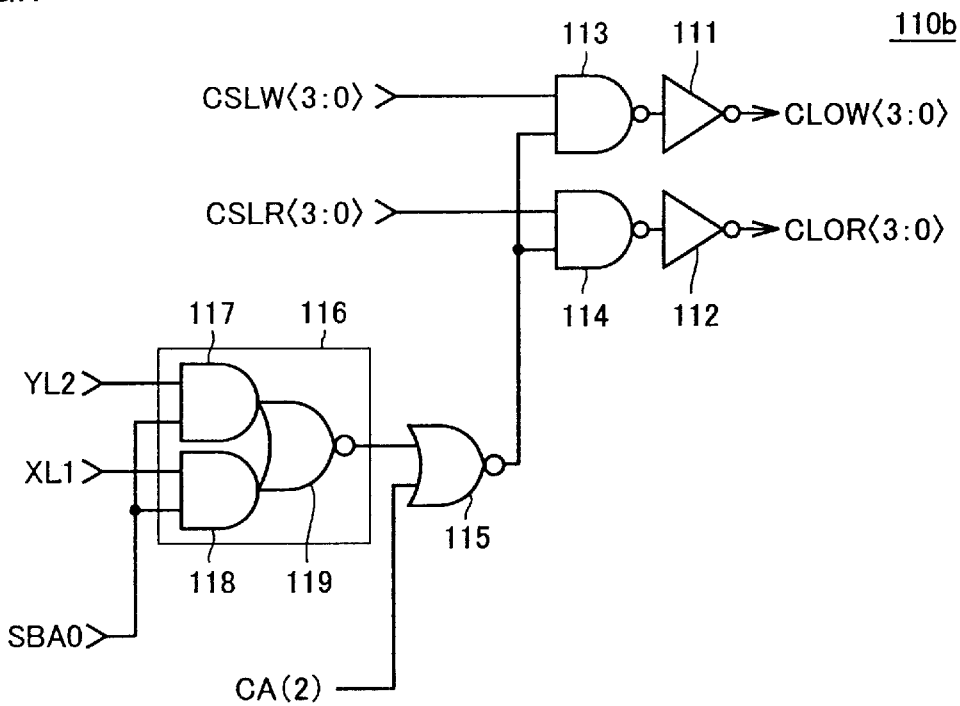
FIG. 7 shows a circuit configuration of a CSL decode circuit 110*b*.

With reference to FIG. 7, CSL decode circuit 110b includes a logic circuit 116, an NOR circuit 115, NAND circuits 113 and 114, and inverters 111 and 112.

Logic circuit 116 includes AND circuits 117 and 118 and an NOR circuit 119. AND circuit 117 receives a latch select signal YL2 and a signal on a bank select line SBA0, performs a logical operation thereon and outputs the result of the operation to NOR circuit 119, and AND circuit 118 receives a latch select signal XL1 and a signal on bank select line SBA0, performs a logical operation thereon and outputs the result of the operation to NOR circuit 119. NOR circuit 119 receives the outputs of AND circuit 117 and 118, performs a logical operation thereon and outputs the result of the operation to NOR circuit 115, and NOR circuit 115 receives an output of logic circuit 116 and column address CA(2) on address signal line LCA(2), performs a logical operation thereon and outputs the result of the operation to NAND circuits 113 and 114, respectively.

NAND circuits 113 and 114 receive signals from column select lines CSLW<3:0> and CSLR<3:0>, respectively, and also receives a signal from NOR circuit 115 to generate column select signals CLOW<3:0> and CLOR<3:0> via inverters 111 and 112, respectively.

For example, if latch control signals YL2 and XL1 each have a high level and a signal on bank select line SBA0 also has a high level, logic circuit 116 outputs a low level. Herein, if column address CA(2) has a low level then NOR circuit 115 outputs a signal of a high level, which is in turn input to NAND circuit 113 and 114. For example, if of column select line CSLW<3:0> column select line CSLW0 has a signal of a high level, then column select signal CLOW0 attains a high level. If of column select line CSLR<3:0> column select line CSLR0 has a signal having a high level then column select signal CLOR0 attains a high level.

Note that CSL decode circuits 110a and 110c are similar in configuration to CSL decode circuit 110b, except that the former are arranged on opposite sides of memory bank# and thus a latch control signal input is a single input and the other input receives ground voltage GND (of a low level).

Figure 8:
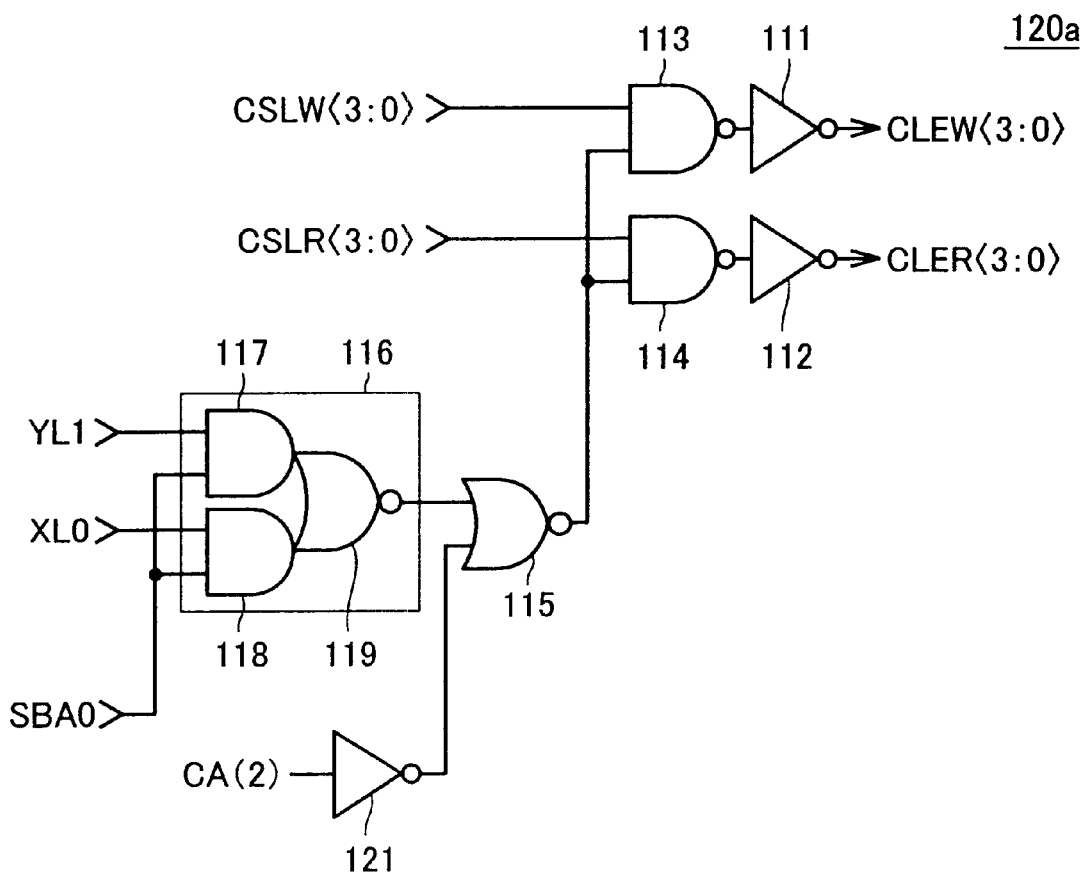
FIG. 8 shows a circuit configuration of a CSL decode circuit 120*a*.

With reference to FIG. 8, CSL decode circuit 120a includes a logic circuit 116, inverters 111 and 112 and 121, an NOR circuit 115, and NAND circuits 113 and 114.

The FIG. 8 circuit differs from the FIG. 7 circuit in that column address CA(2) is received by NOR circuit 115 via inverter 121. The remainder is connected as described with reference to FIG. 7 and thus will not be described specifically.

For example, if latch control signals YL1 and XL0 both have a high level and bank select line SBA0 also has a signal of a high level, logic circuit 116 outputs a low level. Herein, if column address CA(2) has a high level then NOR circuit 115 outputs a signal of a high level, which is in turn input to NAND circuits 113 and 114. If of column select line CSLW<3:0> column select line CSLW0 has a signal of a high level then column select signal CLEW0 attains a high level. If of column select line CSLR<3:0> column select line CSLR0 has a signal having a high level then column select signal CLER0 attains a high level. CSL decode circuit 120b is similar in configuration to CSL decode circuit 120a.

Again with reference to FIG. 5, as in the present configuration, when column select lines CSLW<3:0> and CSLR<3:0> and address signal line LCA(2) transmitting column address CA(2) are provided and connected to a CSL decode circuit, with a uniform load provided, there can be eliminated a difference offset in timing of a column select signal, which differs from the FIG. 28 column decoder 2a as has been described in the conventional art. Thus a faster column-related operation can be achieved.

Third Embodiment

Figure 9:
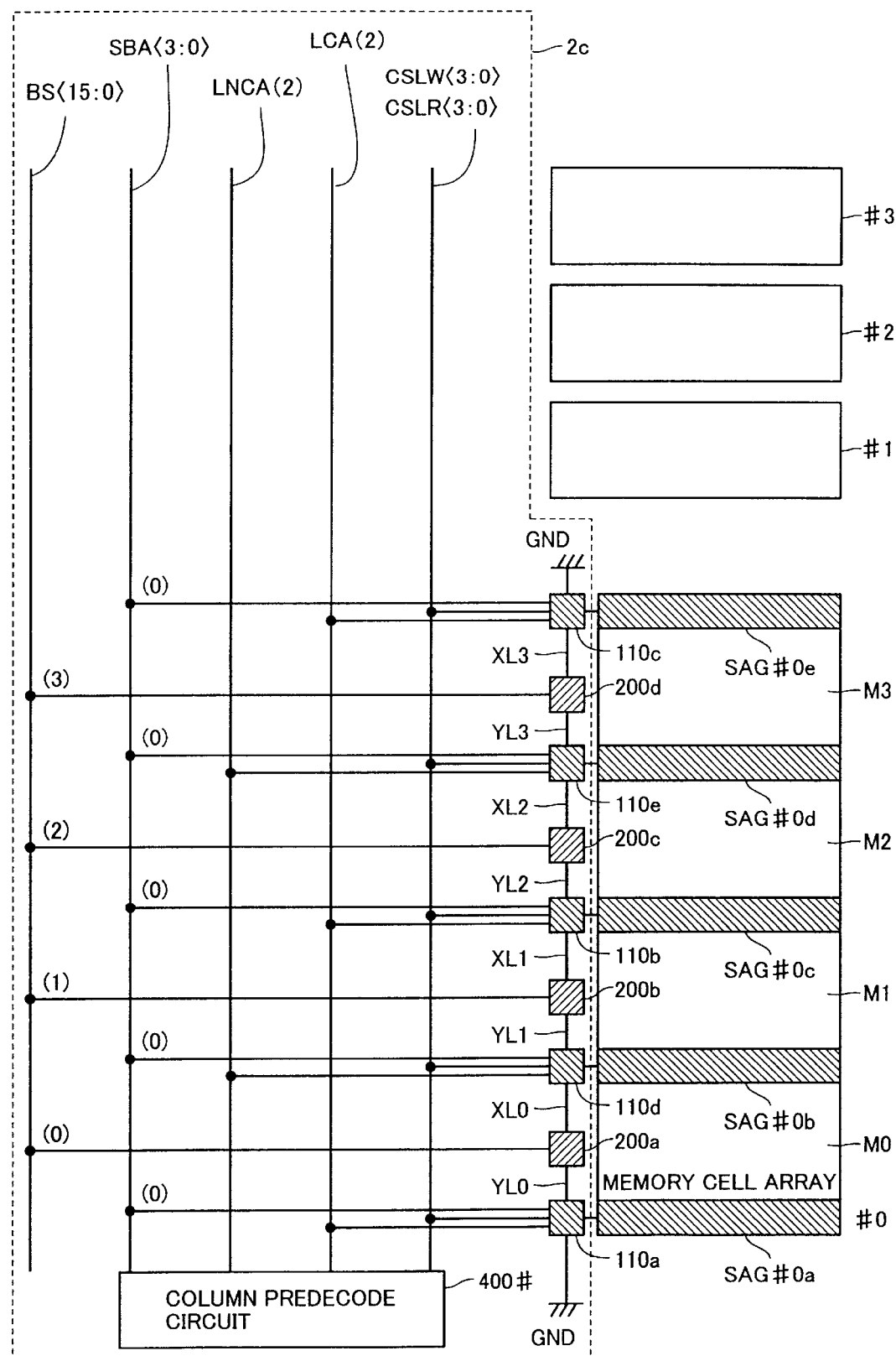
FIG. 9 shows an exemplary variation 2*c* of column decode circuit 2*b* in a third embodiment of the present invention.

With reference to FIG. 9, column decode circuits 2b and 2c are different from each other in that there is provided an address signal line LNCA(2) corresponding to a signal line for an inverted version of a column address CA(2).

In a third embodiment of the present invention, address signal line LNCA(2) is further provided to allow column select lines CSLW<3:0> and CSLR<3:0> to receive a uniform load to achieve a faster column-related operation.

Herein, CSL decode circuits 110a–110e are similar in configuration to CSL decode circuit 110b described in the second embodiment. More specifically, again with reference to FIG. 8, CSL decode circuit 120a does not use inverter 121 to invert column address CA(2). Rather, it can uses address signal line LNCA(2) serving as a line transmitting an inverted version of column address CA(2) to input column address NCA(2) to NOR circuit 115 to allow the same to be similar in configuration to the FIG. 7 CSL decode circuit 110b. CSL decode circuits 110a–110c generate column select signals CSLOR<3:0> and CSLOW<3:0> for an odd-numbered bit line and CSL decode circuits 110d and 110e generate column select signals CSLER<3:0> and CSLOR<3:0> for an even-numbered bit line. The remainder is configured as has been described in the second embodiment and thus will not be described specifically.

Figure 10:
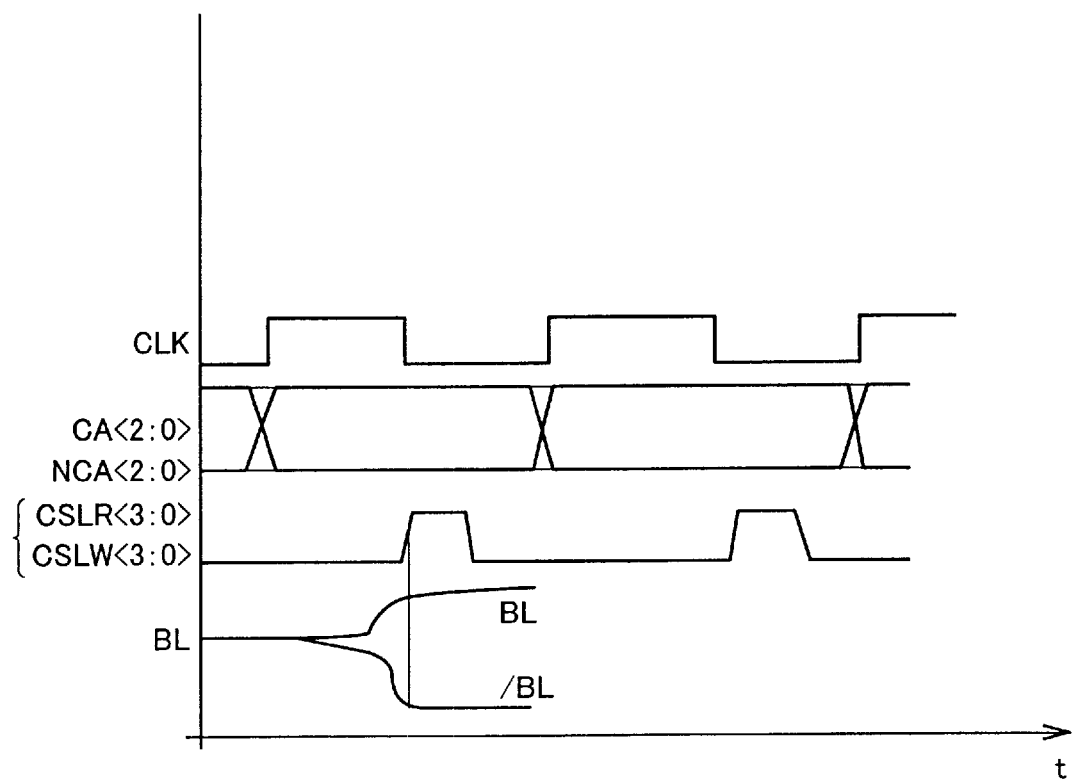
FIG. 10 represents an operation in waveform in the third embodiment.

With reference to FIG. 10, column address CA<2:0> operates in synchronization with a clock signal CLK. Column select lines CSLW<3:0> and CSLR<3:0>, however, are selected in response to a one-short pulse of timing signals WTM and RTM adjusted by timing generation circuit GT.

In setting a timing of column select lines CSLW<3:0> and CSLR<3:0> in a system for reading column select line CSLR<3:0>, a word line is initially activated and data is then read from a memory cell and the data is then amplified by sense amplifier SA. After the data is amplified, any one of column select line CSLR<3:0> is set high and any of column select signal CLER<3:0> (CLOR<3:0>) goes high to read data through input/output line pair GIOR, /GIOR.

If the high level is transmitted to column select line CSLR<3:0> by a signal timed faster, however, column select signal CLER<3:0> (CLOR<3:0>) accordingly goes high and sense amplifier SA cannot operate normally. This also applies to column select line CSLW<3:0> in writing data. Thus, the difference in timing of column address signals CA(2) and NCA(2) is a more significant issue than that in timing introduced when column select signals CSLR<3:0> and CSLW<3:0> are selected.

In the third embodiment, address signal lines LCA(2) and LNCA(2) have a difference in load of 3:2 while column select lines CSLR<3:0> and CSLW<3:0> are loaded uniformly. Since column address CA(2) is a signal switched in response to clock signal CLK, a rapid operation is not required. As such, if a load is out of balance it does have a negative effect on rapid column-related operation. Column select lines CSLR<3:0> and CSLW<3:0> receive a signal as controlled by timing generation circuit GT and column select lines CSLR<3:0> and CSLW<3:0> uniform in load allow a precise timing operation to provide a faster column-related operation. Each CSL decode circuit can be identical in circuit configuration to reduce the number of components and a layout area, as compared to the second embodiment.

Fourth Embodiment

Figure 11:
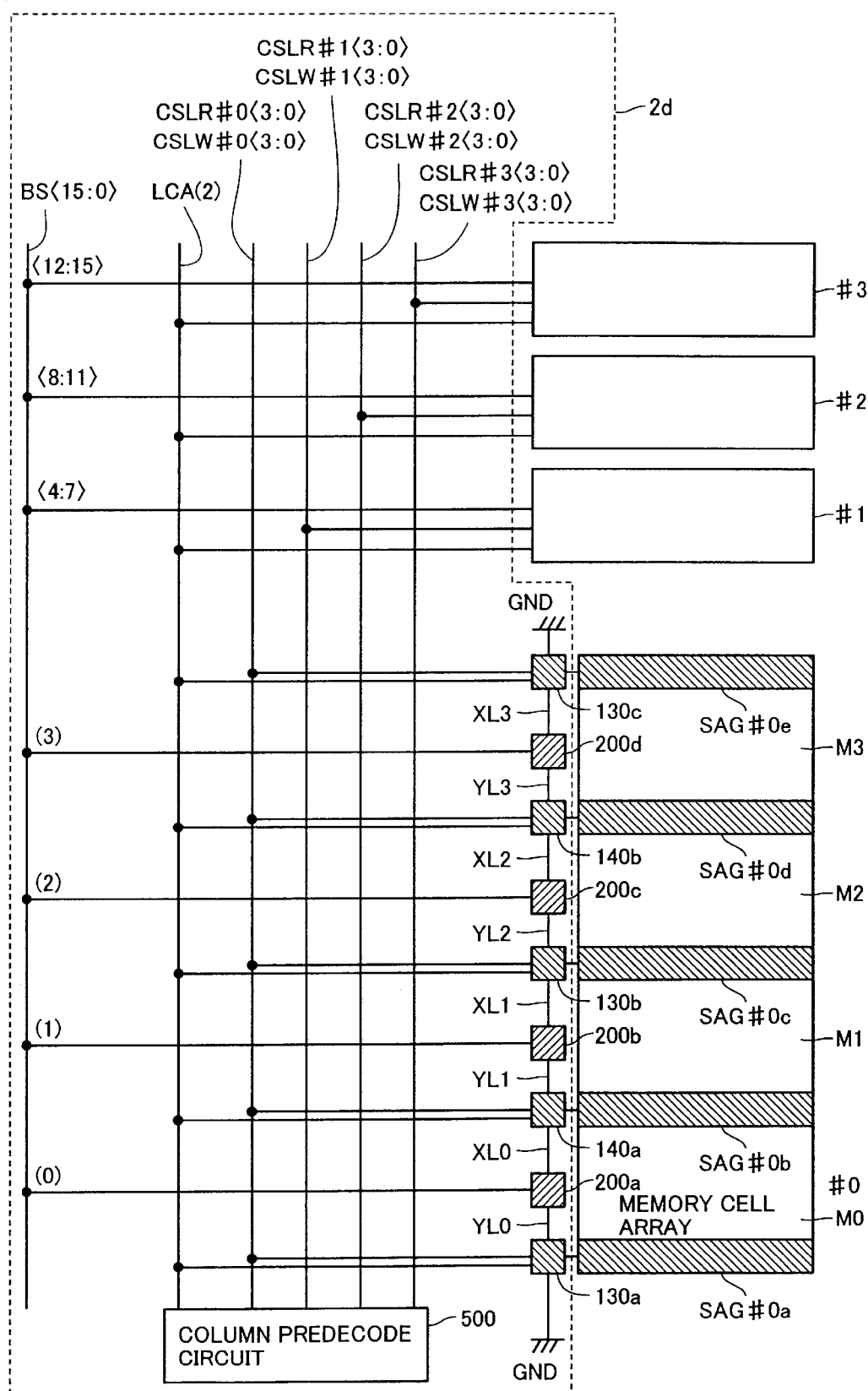
FIG. 11 shows a circuit configuration of a column decode circuit 2*d* in a fourth embodiment of the present invention.

With reference to FIG. 11, a column decode circuit 2d includes a column predecode circuit 500, CSL decode circuits 130a–130c (hereinafter generally referred to as a CSL decode circuit 130) and 140a and 140b, block select latch circuits 200a–200d, a block select line BS<15:0>, an address signal line LCA(2), column select lines CSLR#0<3:0>, CSLR#1<3:0>, CSLR#2<3:0> and CSLR#3<3:0> corresponding to each of memory banks #0–#3 and dedicated to reading data, and column select lines CSLW#0<3:0>, CSLW#1<3:0>, CSLW#2<3:0> and CSLW#3<3:0> corresponding to each of memory banks #0–#3 and dedicated to writing data, hereinafter generally referred to as column select lines CSLR# and CSLW#.

In the fourth embodiment column select lines CSLR#<3:0> and CSLW#<3:0> are arranged for each memory bank# exclusively to allow the column select lines to receive a uniform load.

Figure 12:
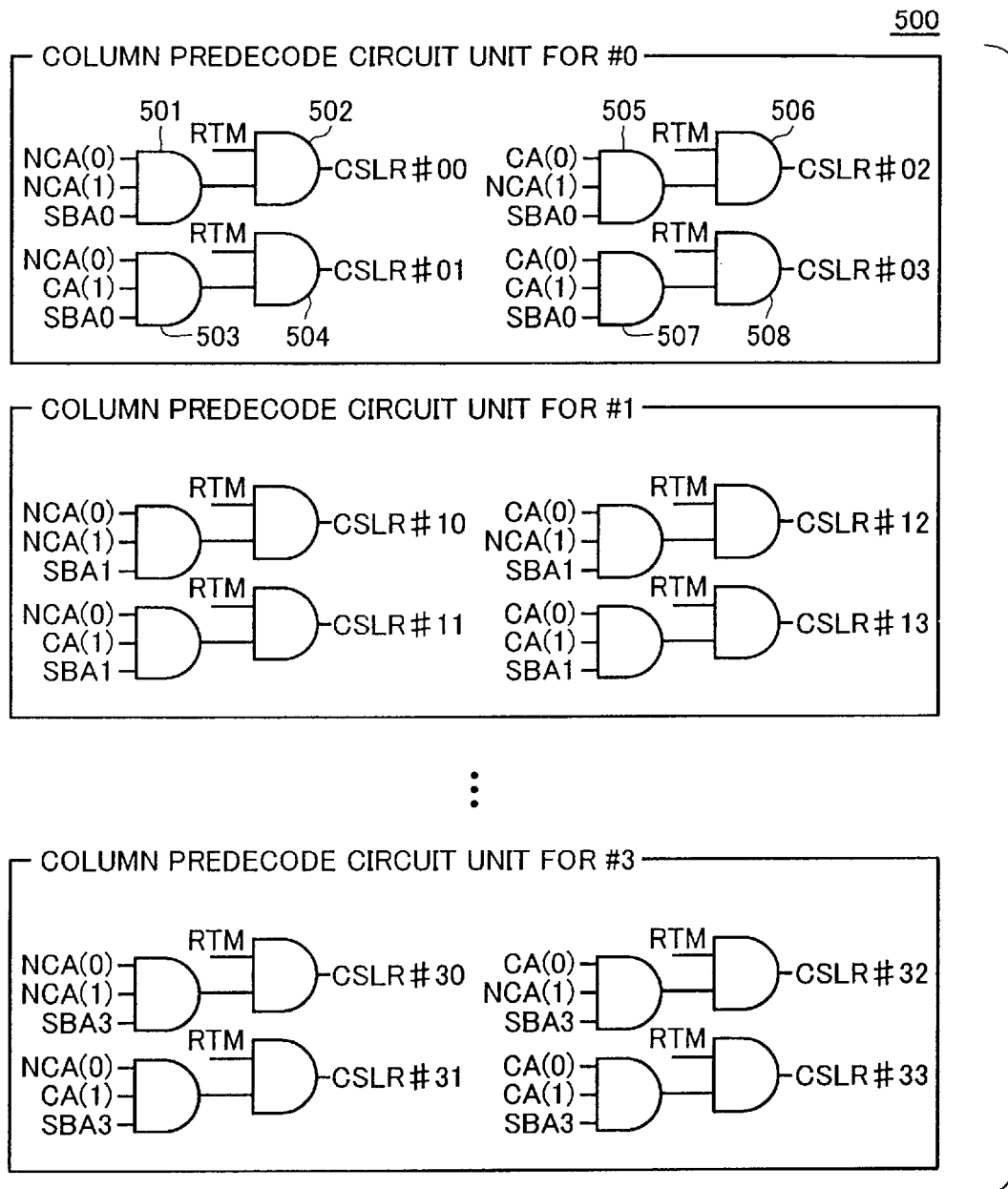
FIG. 12 shows a circuit configuration of a column predecode circuit 500.

With reference to FIG. 12, column predecode circuit 500 is configured of column predecode circuit units for memory banks #0–#3, respectively. Note that the figure only shows a circuit configuration of a reading column predecode circuit unit, it also applies to a writing column predecode circuit. The FIG. 12 circuit differs from the FIG. 6 circuit 400 in that the former has bank select line SBA<3:0> included in column predecode circuit 500.

The column predecode circuit unit for memory bank#0 will now be described. The other column predecode circuit units are similarly configured and thus will not be described specifically.

Note that although not shown in the figure, column address NCA<1:0> corresponds to column address CA<1:0> that is inverted by inverter INV. Furthermore, timing signal RTM is generated by timing generation circuit GT in response to clock signal Read. CLK input exclusively for a read operation.

An AND circuit 501 receives column addresses NCA(0) and NCA(1) and an input on bank select line SBA0, performs a logical operation thereon and outputs the result of the operation to an AND circuit 502, and AND circuit 502 receives timing signal RTM and an output of AND circuit 501, performs a logical operation thereon and transmits the result of the operation to column select line CSLR#00. An AND circuit 503 receives column addresses NCA(0) and CA(1) and an input on bank select line SBA0, performs a logical operation thereon and outputs the result of the operation to an AND circuit 504, and AND circuit 504 receives timing signal RTM and an output of AND circuit 503, performs a logical operation thereon and transmits the result of the operation to column select line CSLR#01.

An And circuit 505 receives column addresses CA(0) and NCA(1) and an input on bank select line SBA0, performs a logical operation thereon and outputs the result of the operation to an AND circuit 506, and AND circuit 506 receives timing signal RTM and an output of the AND circuit 505, performs a logical operation thereon and transmits the result of the operation to column select line CSLR#02. An AND circuit 507 receives column addresses CA(0) and CA(1) and an input on bank select line SBA0, performs a logical operation thereon and outputs the result of the operation to an AND circuit 508, and AND circuit 508 receives timing signal RTM and an output of AND circuit 507, performs a logical operation thereon and transmits the result of the operation to column select lines CSLR#03.

For example, if when timing signal RTM has a high level the column predecode circuit unit is activated and column addresses NCA(0) and NCA(1) and bank select line SBA0 have a high level then column select line CSLR#00 is activated to attain a high level to select a column to read data.

Figure 13:
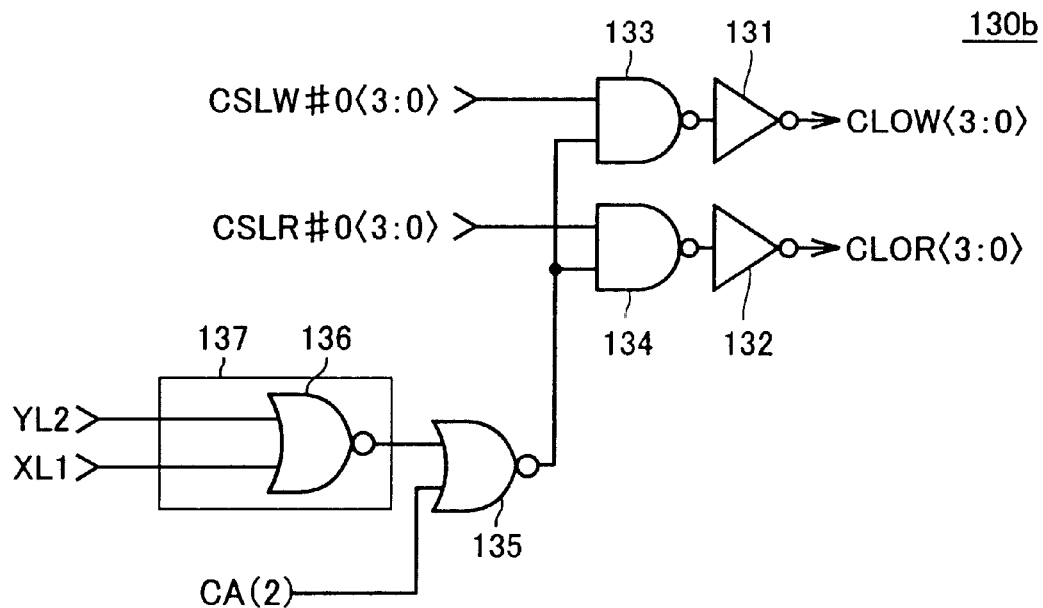
FIG. 13 shows a circuit configuration of a CSL decode circuit 130*b*.

FIG. 13 shows a circuit configuration of a CSL decode circuit 130b.

CSL decode circuit 130b includes a logic circuit 137, an NOR circuit 135, NAND circuits 133 and 134, and inverters 131 and 132.

Logic circuit 137 includes an NOR circuit 136 and it receives latch control signals YL2 and XL1 input, performs a logical operation thereon and outputs the result of the operation to NOR circuit 135. NOR circuit 135 receives column address CA(2) and an output of NOR circuit 136, performs a logical operation thereon and outputs the result of the operation to NAND circuit 133 and 134. NAND circuit 133 is connected to column select line CSLW#0<3:0> and it receives a signal input thereon and an output of NOR circuit 135, performs a logical operation thereon and outputs the result of the operation as a column select signal CLOW<3:0> via inverter 131. NAND circuit 134 is connected to column select line CSLR#0<3:0> and it receives a signal input thereon and an output of NOR circuit 135, performs a logical operation thereon and outputs the result of the operation as a column select signal CLOR<3:0> via inverter 132.

For example, if latch control signals YL2 and XL1 have a high level and column address CA(2) has a low level, NOR circuit 135 outputs a signal having a high level. Herein, if of column select line CSLW#0<3:0> column select line CSLW#0 has a high level then column select signal CLOW0 goes high and if column select line CSLR#0 has a high level then column select signal CLOR0 goes high.

Note that for CSL decode circuits 130a and 130c, arranged on opposite sides of memory bank#0, from a latch control circuit is received a single input and as the other input is received a ground voltage GND (having a low level). The remainder is similar to CSL decode circuit 130b and thus will not be described specifically.

Figure 14:
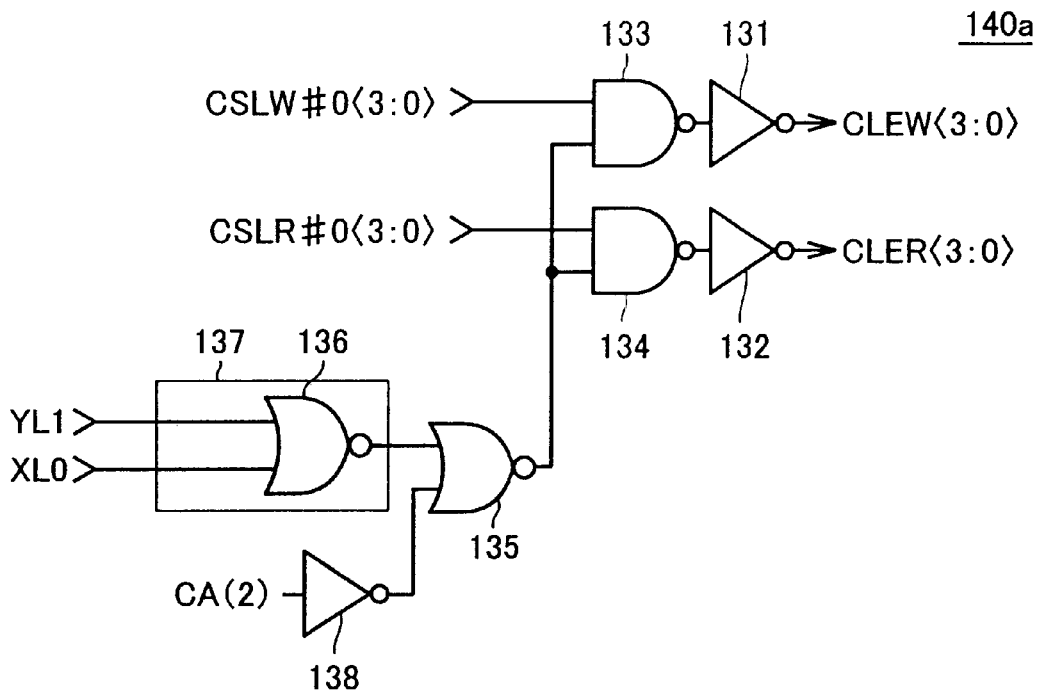
FIG. 14 shows a circuit configuration of a CSL decode circuit 140*a*.

With reference to FIG. 14, CSL decode circuit 140a differs from the FIG. 13 CSL decode circuit 130b in that in the former, NOR circuit 135 receives column address CA(2) that is inverted by inverter 138. The remainder is similar in configuration to the FIG. 13 CSL decode circuit 130b and thus will not be described specifically. Also note that CSL decode circuit 140b is similarly configured.

Again, with reference to FIG. 5, for column decode circuit 2b of the first embodiment all sense amplifier bands SAG# share common column select lines CSLW<3:0> and CSLR<3:0>. This would increase a load of a signal line. Accordingly, in the fourth embodiment, as shown in FIG. 11, column select lines CSLR# and CSLW# are arranged for each memory bank#. This can alleviate a load of a signal line of each of column select lines CSLR# and CSLW# to provide a faster operation and also a uniformly balanced load.

The fourth embodiment allows column select lines CSLR# and CSLW# to have imposed thereon one fourth of a load on column select lines CSLR and CSLW of the second embodiment to provide a faster operation and also equalize loads on column select lines CSLR# and CSLW# to precisely control a timing signal.

Fifth Embodiment

Figure 15:
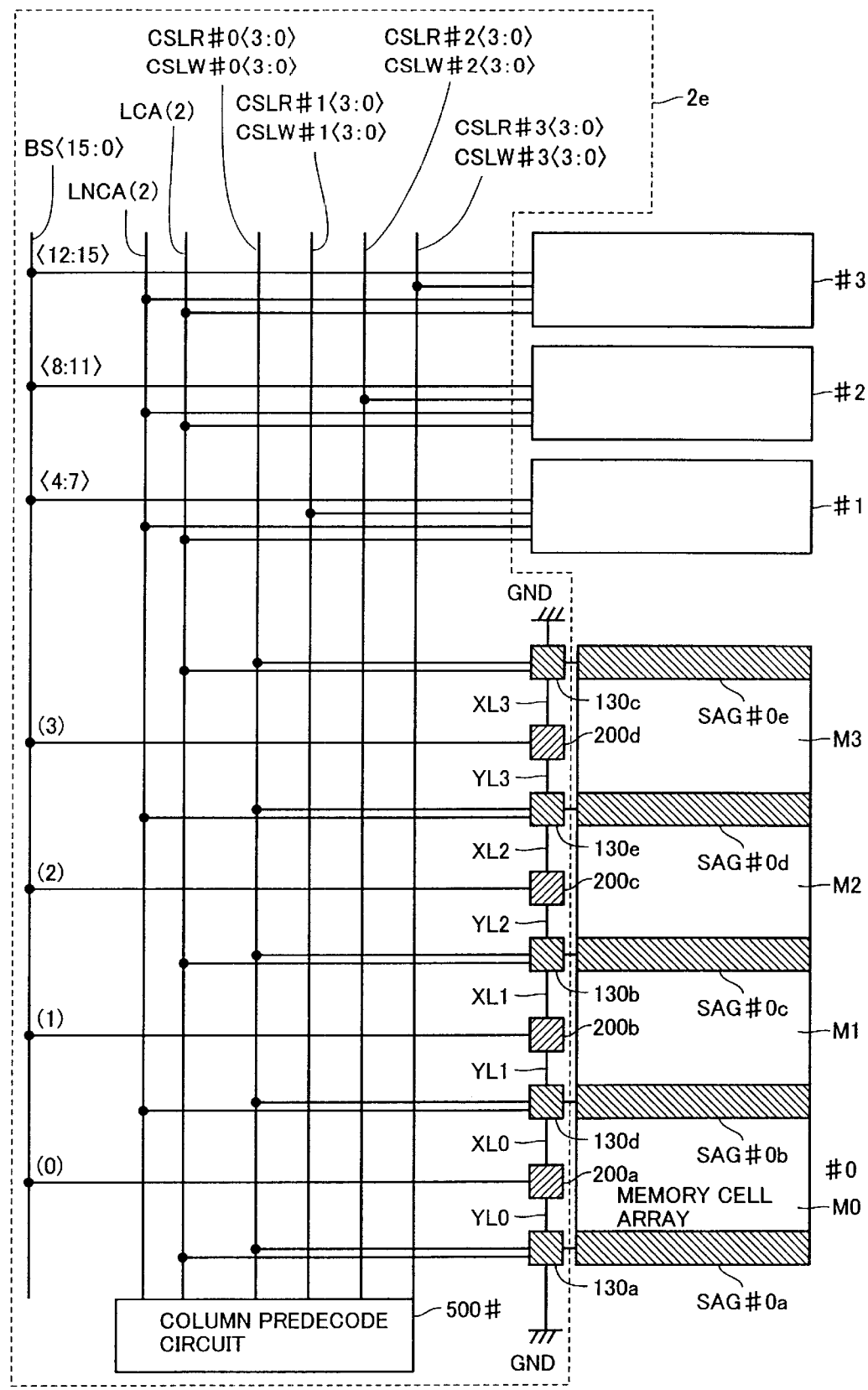
FIG. 15 shows a circuit configuration of a column decode circuit 2*e* in a fifth embodiment of the present invention.

FIG. 15 shows a circuit configuration of a column decode circuit 2e in a fifth embodiment of the present invention.

The FIG. 15 column decode circuit 2e differs from the FIG. 11 column decode circuit 2d in that in the former an address signal line LNCA(2) is further provided and CSL decode circuits 140a and 140b are replaced with CSL decode circuits 130d and 130e, respectively.

CSL decode circuits 140a and 140b can be replaced with CSL decode circuits 130d and 130e identical in configuration to CSL decode circuit 130b and column address NCA (2) can be input on address signal line LNCA(2) to configure a circuit equivalent to that of the fourth embodiment.

The configuration of the fifth embodiment, as compared to that of the fourth embodiment, can facilitate designing a circuit configuration. Furthermore, column select lines CSLR# and CSLW# can be provided for each memory bank to further reduce a load on each of the column select lines to provide a faster column-related operation.

Note that also in this configuration the difference in timing of column addresses CA(2) and NCA(2) is not disadvantageous in providing a further faster column-related operation, as has been described in the third embodiment.

Sixth Embodiment

Figure 16:
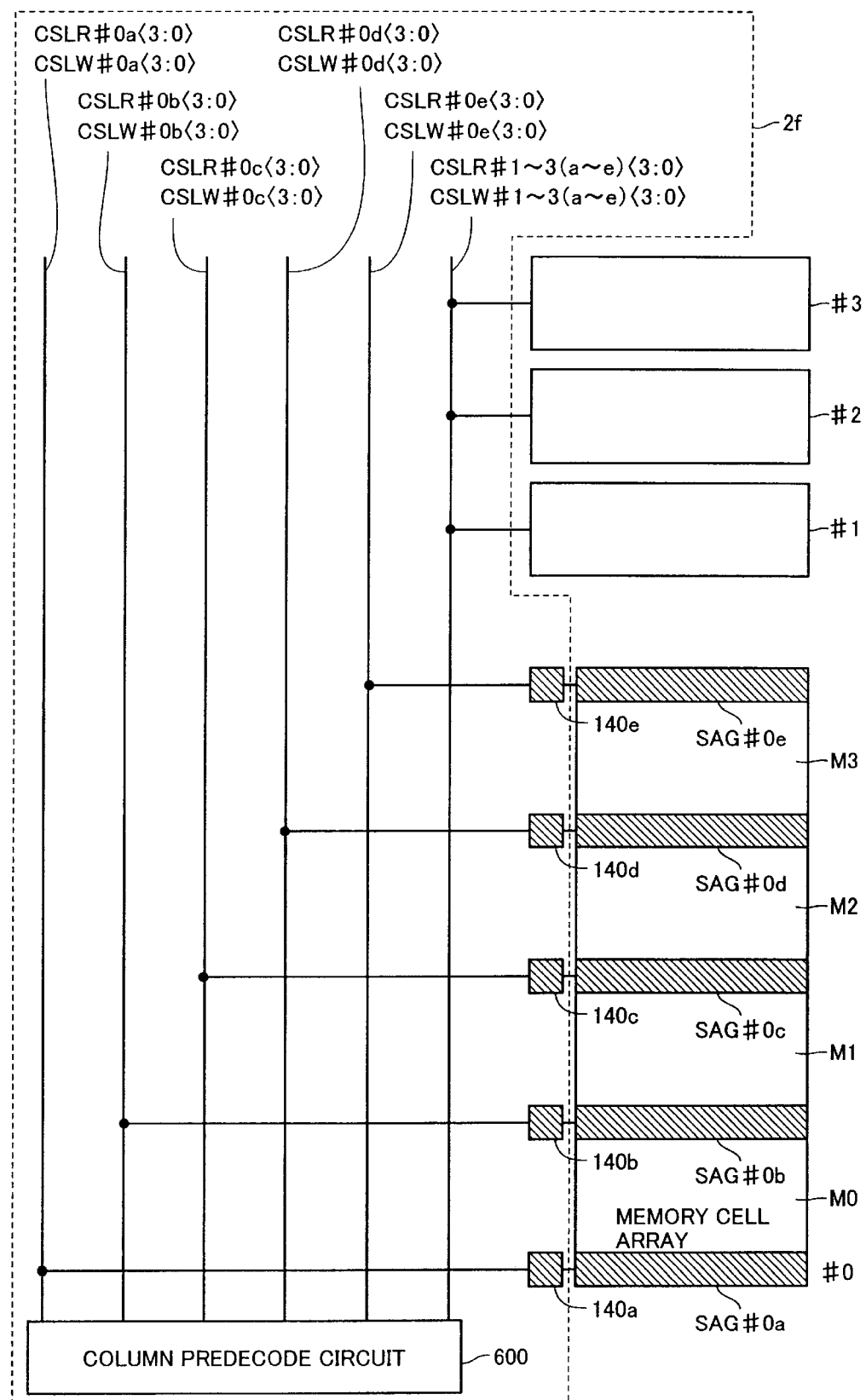
FIG. 16 shows a circuit configuration of a column decode circuit 2*f* in a sixth embodiment of the present invention.

With reference to FIG. 16, in a sixth embodiment of the present invention a column select line corresponding to each sense amplifier band SAG# is arranged to provide a uniform load. More specifically, memory bank#0 is provided with column select lines CSLR#0a<3:0> to CSLR#0e<3:0> and CSLW#0a to CSLW#0e<3:0> for reading and writing data, respectively, and so are the other memory banks.

Figure 17:
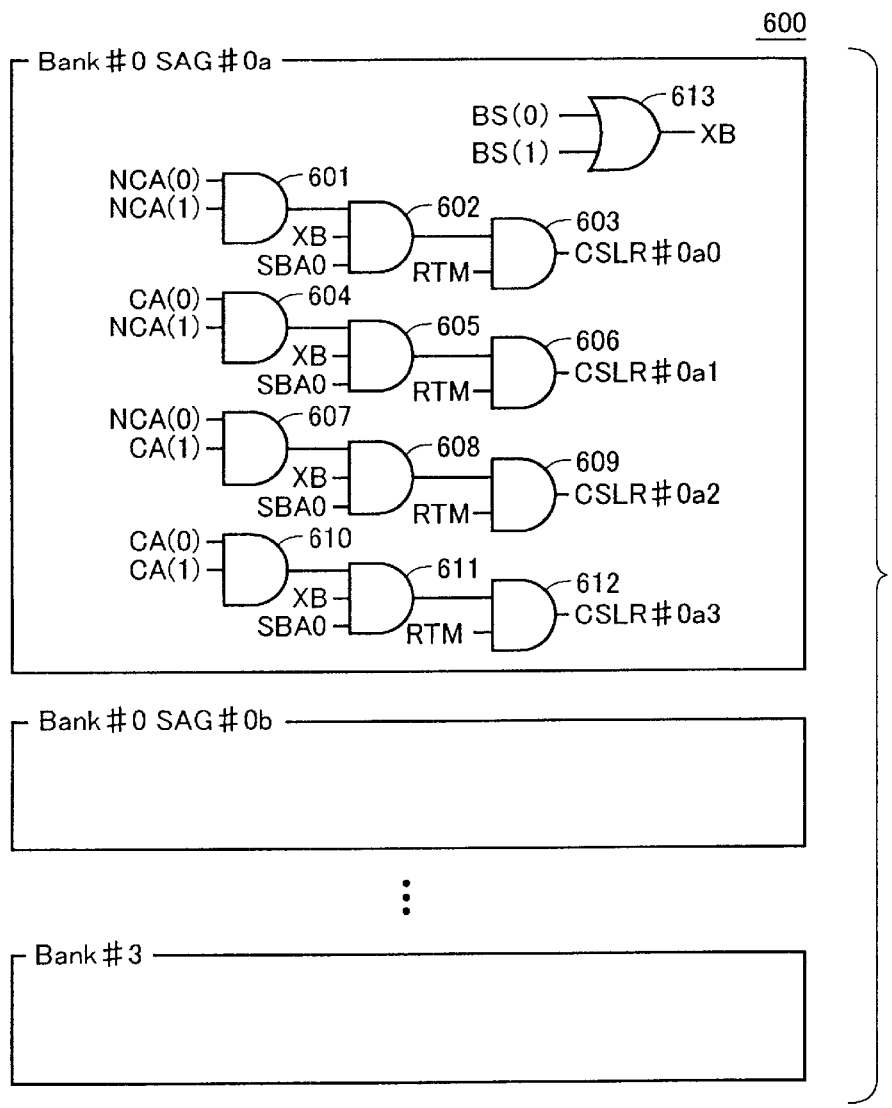
FIG. 17 shows a circuit configuration of a column predecode circuit 600.

FIG. 17 only shows a column predecode circuit unit for memory bank#0 and sense amplifier band SAG#0a. Note that the figure also applies to the column predecode circuit units for the other sense amplifier bands SAG# and thus will not be described specifically. The FIG. 17 circuit 600 differs from the FIG. 12 circuit 500 in that in the former, each column select line is selected with a block select line BS<16:0> further included. At such, block select line BS<15:0> is not arranged in a column decoder 2f.

Note that although not shown in the figure, column address NCA<3:0> is a signal corresponding to column address CA<3:0> that is inverted by inverter INV. Furthermore, timing signal RTM is generated by timing generation circuit GT in response to clock signal Read. CLK input dedicated to reading data. Although the present description is provided for reading data, it is also applicable to writing data.

A control signal XB is an output of an OR circuit 613 that corresponds to a result of a logical operation thereby on signals input on block select lines BS(0) and BS(1).

An AND circuit 601 receives column addresses NCA(0) and NCA(1), performs a logical operation thereon and outputs a result the operation to an AND circuit 602, and AND circuit 602 receives control signal XB, a signal on bank select line SBA0 and an output of AND circuit 601, performs a logical operation thereon and outputs the result of the operation to an AND circuit 603. AND circuit 603 receives an output of AND circuit 602 and timing signal RTM input, performs a logical operation thereon and transmits the result of the operation to a column select line CSLR#0a0.

An AND circuit 604 receives column addresses CA(0) and NCA(1), performs a logical operation thereon and outputs the result of the operation to an AND circuit 605, and AND circuit 605 receives an output of AND circuit 604, control signal XB and a signal on bank select line SBA(0), performs a logical operation thereon and outputs the result of the operation to an AND circuit 606, and AND circuit 606 receives an output of AND circuit 605 and timing signal RTM, performs a logical operation thereon and transmits the result of the operation to a column select line CSLR # 0a1.

An AND circuit 607 receives column addresses NCA(0) and CA(1), performs a logical operation thereon and outputs the result of the operation to an AND circuit 608, and AND circuit 608 receives an output of AND circuit 607, control signal XB and a signal on bank select line SBA(0), performs a logical operation thereon and outputs the result of the operation to an AND circuit 609, and AND circuit 609 receives an output of AND circuit 608 and timing signal RTM, performs a logical operation thereon and transmits the result of the operation to a column select line CSLR # 0a2.

An AND circuit 610 receives column addresses CA(0) and CA(1), performs a logical operation thereon and outputs the result of the operation to an AND circuit 611 and AND circuit 611 receives control signal XB, an output of AND circuit 610 and a signal on bank select line SBA(0), performs a logical operation thereon and outputs the result of the operation to an AND circuit 612. AND circuit 612 receives an output of AND circuit 611 and timing signal RTM, performs a logical operation thereon and transmits the result of the operation to a column select line CSLR #0a3.

Figure 18:
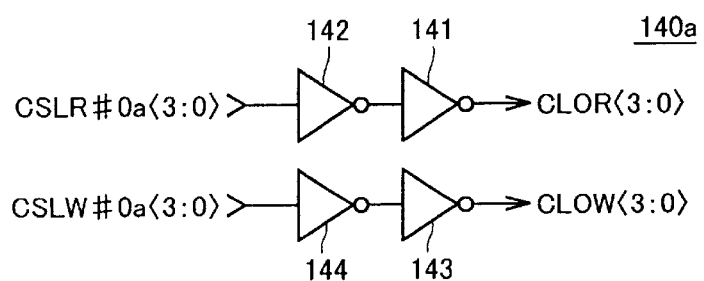
FIG. 18 shows a circuit configuration of a CSL decode circuit 140*a*.

FIG. 18 shows a circuit configuration of a CSL decode circuit 140a.

CSL decode circuit 140a includes inverters 141–144.

Inverters 141 and 142 are connected in series and so are inverters 143 and 144. Column select line CSLR#0a<3:0> is connected to inverter 142 and inverter 141 generates column select signal CLOR<3:0>. Column select line CSLW#0a<3:0> is connected to inverter 144 and inverter 143 generates column select signal CLOW<3:0>. For example, if column select line CSLW#0a0 has a high level then column select signal CLOW0 goes high and if column select line CSLR#0a0 has the high level then column select signal CLOW0 goes high.

Seventh Embodiment

In a seventh embodiment of the present invention a dummy load is applied on a column select line to provide a pseudo, uniform load.

Figure 19:
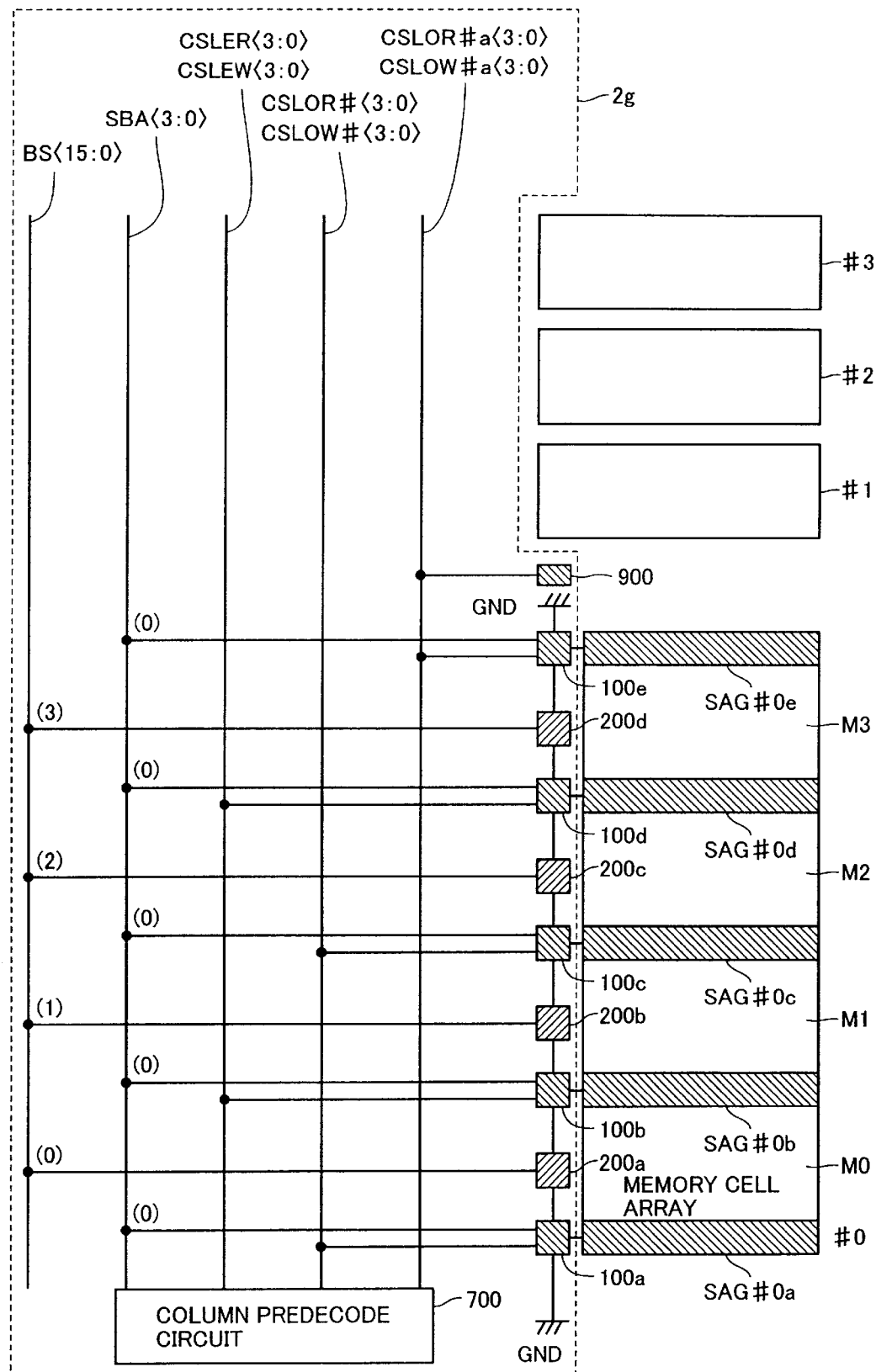
FIG. 19 shows a circuit configuration of a column decode circuit 2*g* in a seventh embodiment of the present invention.

FIG. 19 differs from FIG. 28 in that in the former figure, column select line CSLOR<3:0> is divided in arrangement. More specifically, column select lines CSLOR<3:0> and CSLOW<3:0> are divided to arrange column select lines CSLOR#<3:0> and CSLOW#<3:0> and CSLOR#a<3:0> and CSLOW#a<3:0>, and a dummy load circuit 900 is additionally provided.

Although not shown in the figure, column address NCA<3:0> corresponds to column address CA<3:0> that is inverted by inverter INV. Timing signal RTM is generated by a timing generation circuit receiving clock signal Read. CLK dedicated to reading data.

Figure 20:
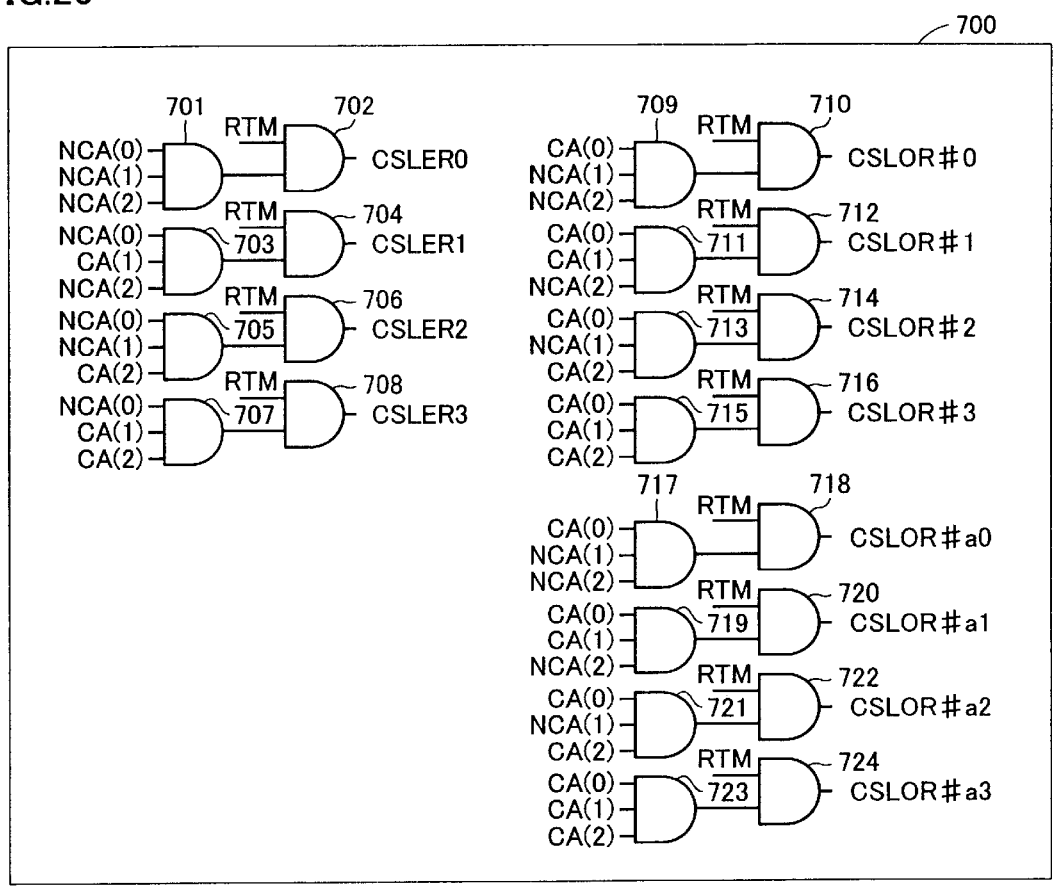
FIG. 20 shows a circuit configuration of a column predecode circuit 700.

With reference to FIG. 20, an AND circuit 701 receives column addresses NCA(0), NCA(1) and NCA(2), performs a logical operation thereon and outputs the result of the operation to an AND circuit 702. AND circuit 702 receives timing signal RTM and an output of AND circuit 701, performs a logical operation thereon and transmits the result of the operation to column select line CSLER0.

An AND circuit 703 receives column addresses NCA(0), CA(1) and NCA(2), performs a logical operation thereon and outputs the result of the operation to an AND circuit 704. AND circuit 704 receives timing signal RTM and an output of AND circuit 703, performs a logical operation thereon and transmits the result of the operation to column select line CSLER1.

An AND circuit 705 receives column addresses NCA(0), NCA(1) and CA(2), performs a logical operation thereon and outputs the result of the operation to an AND circuit 706. AND circuit 706 receives timing signal RTM and an output of AND circuit 705, performs a logical operation thereon and transmits the result of the operation to column select line CSLER2.

An AND circuit 707 receives column addresses NCA(0), CA(1) and CA(2), performs a logical operation thereon and outputs the result of the operation to an AND circuit 708. AND circuit 708 receives timing signal RTM and an output of AND circuit 707, performs a logical operation thereon and transmits the result of the operation to column select line CSLER3.

An AND circuit 709 receives column addresses CA(0), NCA(1) and NCA(2), performs a logical operation thereon and outputs the result of the operation to an AND circuit 710. AND circuit 710 receives timing signal RTM and an output of AND circuit 709, performs a logical operation thereon and transmits the result of the operation to column select line CSLOR#0.

An AND circuit 711 receives column addresses CA(0), CA(1) and NCA(2), performs a logical operation thereon and outputs the result of the operation to an AND circuit 712. AND circuit 712 receives timing signal RTM and an output of AND circuit 711, performs a logical operation thereon and transmits the result of the operation to column select line CSLOR#1.

An AND circuit 713 receives column addresses CA(0), NCA(1) and CA(2), performs a logical operation thereon and outputs the result of the operation to an AND circuit 714. AND circuit 714 receives timing signal RTM and an output of AND circuit 713, performs a logical operation thereon and transmits the result of the operation to column select line CSLOR#2.

An AND circuit 715 receives column addresses CA(0), CA(1) and CA(2), performs a logical operation thereon and outputs the result of the operation to an AND circuit 716. AND circuit 716 receives timing signal RTM and an output of AND circuit 715, performs a logical operation thereon and transmits the result of the operation to column select line CSLOR#3.

An AND circuit 717 receives column addresses CA(0), NCA(1) and NCA(2), performs a logical operation thereon and outputs the result of the operation to an AND circuit 718. AND circuit 718 receives timing signal RTM and an output of AND circuit 717, performs a logical operation thereon and transmits the result of the operation to column select line CSLOR#a0.

An AND circuit 719 receives column addresses CA(0), CA(1) and NCA(2), performs a logical operation thereon and outputs the result of the operation to an AND circuit 720. AND circuit 720 receives timing signal RTM and an output of AND circuit 719, performs a logical operation thereon and transmits the result of the operation to column select line CSLOR#a1.

An AND circuit 721 receives column addresses CA(0), NCA(1) and CA(2), performs a logical operation thereon and outputs the result of the operation to an AND circuit 722. AND circuit 722 receives timing signal RTM and an output of AND circuit 721, performs a logical operation thereon and transmits the result of the operation to column select line CSLOR#a2.

An AND circuit 723 receives column addresses CA(0), CA(1) and CA(2), performs a logical operation thereon and outputs the result of the operation to an AND circuit 724. AND circuit 724 receives timing signal RTM and an output of AND circuit 723, performs a logical operation thereon and transmits the result of the operation to column select line CSLOR#a3.

Note that although the description is only provided for reading data it is also applicable to writing data.

Figure 21A:
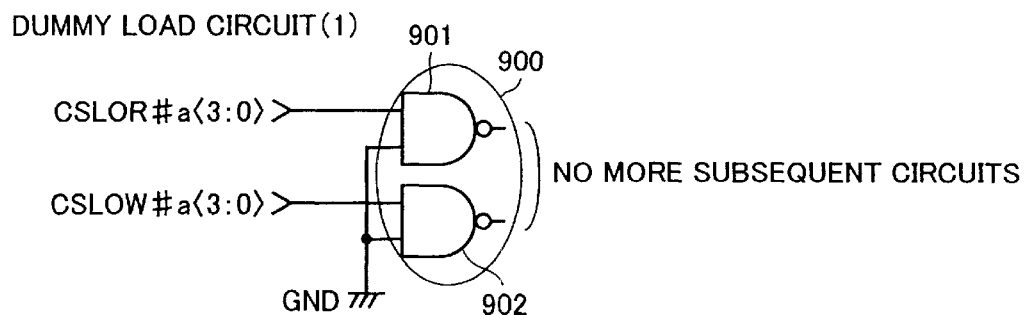
FIGS. 21A and 21B show circuit configurations of dummy load circuits 900 and 910, respectively.

FIG. 21A shows a circuit configuration of dummy load circuit 900.

Dummy load circuit 900 includes NAND circuits 901 and 902.

NAND circuit 901 receives a signal on column select line CSLOR#a<3:0> and a ground voltage GND (of a low level). NAND circuit 902 receives a signal on column select line CSLOW#a<3:0> and ground voltage GND (of the low level). Note that NAND circuits 901 and 902 are adapted to have the same size as NAND circuits 104 and 105 employed in CSL decode circuit 100.

Figure 21B:
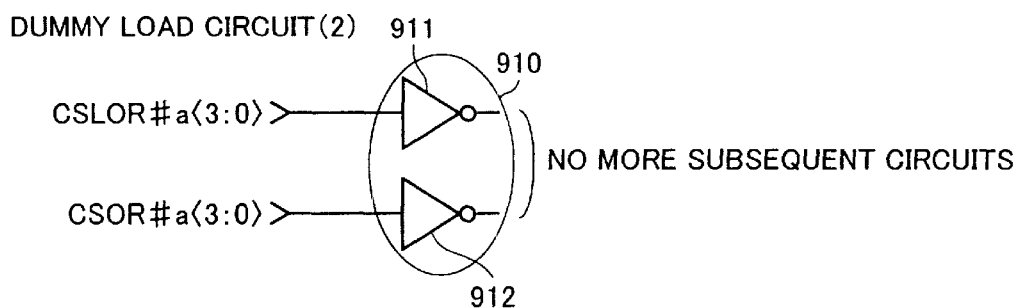

FIG. 21B shows a circuit configuration of a dummy load circuit 910 capable of replacing dummy load circuit 900.

Dummy load circuit 910 includes inverters 911 and 912.

Inverter 911 receives a signal on column select line CSLOR#a<3:0>. Inverter 912 receives a signal on column select line CSLOW#a<3:0>. Herein, inverters 911 and 912 are adapted to have the same size as inverters 101 and 102 used in CSL decode circuit 100.

The additional dummy load circuit 900 allows column select lines CSLOR#a<3:0> and CSLOW#a<3:0> and CSLOR#<3:0> and CSLOW<3:0> to be uniform in load. Furthermore, while in the second embodiment as shown in FIG. 5 a maximum of three sense amplifier bands SAG# simultaneously receive a signal, in the sixth embodiment a maximum of two sense amplifier bands can receive the signal to alleviate a load on a signal line and also to allow a signal to be transmitted faster.

Eighth Embodiment

Figure 22:
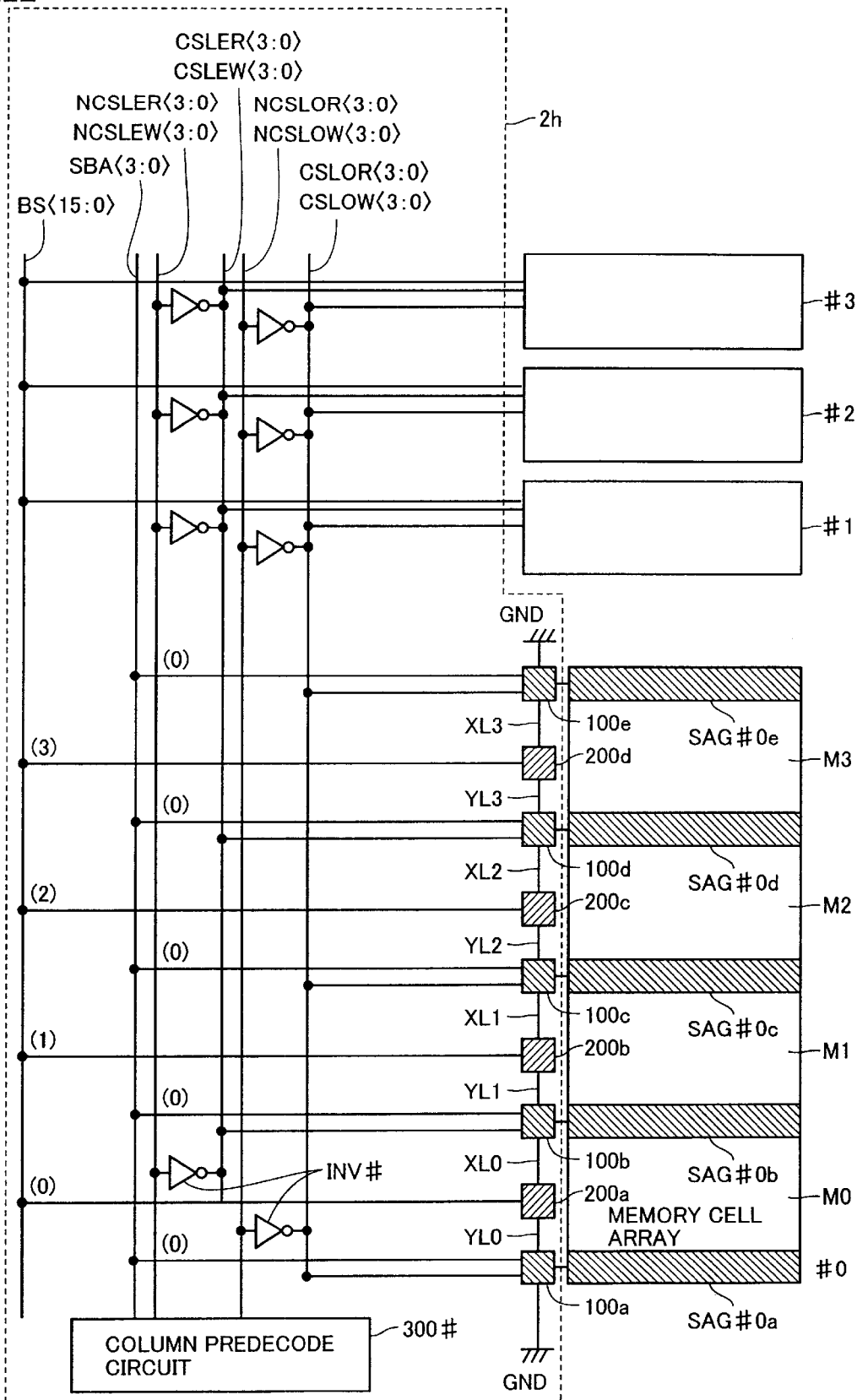
FIG. 22 shows a circuit configuration of a column decode circuit 2*h* in an eighth embodiment of the present invention.

FIG. 22 shows a circuit configuration of a column decode circuit 2h in an eighth embodiment of the present invention.

The present invention differs from the second embodiment shown in FIG. 5 in that for column select lines CSLER<3:0> and CSLEW<3:0>, and CSLOR<3:0> and CSLOW<3:0>, main column select lines NCSLER<3:0> and NCSLOR<3:0> dedicated to reading data and main column select lines NCSLEW<3:0> and NCSLOW<3:0> dedicated to writing data are provided, respectively.

Herein main column select lines NCSLER<3:0>, NCSLEW<3:0> NCSLOR<3:0> and NCSLOW<3:0> are lines for signals corresponding to inverted versions of CSLER<3:0>, CSLEW<3:0> CSLOR<3:0> and CSLOW<3:0>, respectively.

Note that although not shown in the figure, column predecode circuit 300# transmits signals corresponding to inverted versions of column select lines CLSER<3:0> and CLSOR<3:0> to main column select lines NCLSER<3:0> and NCLSOR<3:0> respectively corresponding to column select lines CLSER<3:0> and CLSOR<3:0> of the FIG. 28 column predecode circuit 300.

Furthermore, from main column select lines NCSLER<3:0> and NCSLEW<3:0> are connected to column select lines CSLER<3:0> and CSLEW<3:0> via inverter INV# to repeat a signal. Furthermore, also for column select lines NCSLOR<3:0> and NCSLOW<3:0> inverter INV# is connected to column select lines CSLOR<3:0> and CSLOW<3:0> to repeat a signal.

In the circuit configuration of the eighth embodiment, column select lines CSLER<3:0> and CSLEW<3:0>, and CSLOR<3:0> and CSLOW<3:0> are not uniform, although in this circuit configuration, as compared with column decode circuit 2a, inverter INV# can shape a waveform to reduce a balance in load.

Furthermore, main column select lines NCSLER<3:0> and NCSLEW<3:0>, and NCSLOR<3:0> and NCSLOW<3:0> can be uniform in load to reduce an unbalance in load preventing a rapid operation and thus achieve a faster column-related operation.

Ninth Embodiment

Figure 23:
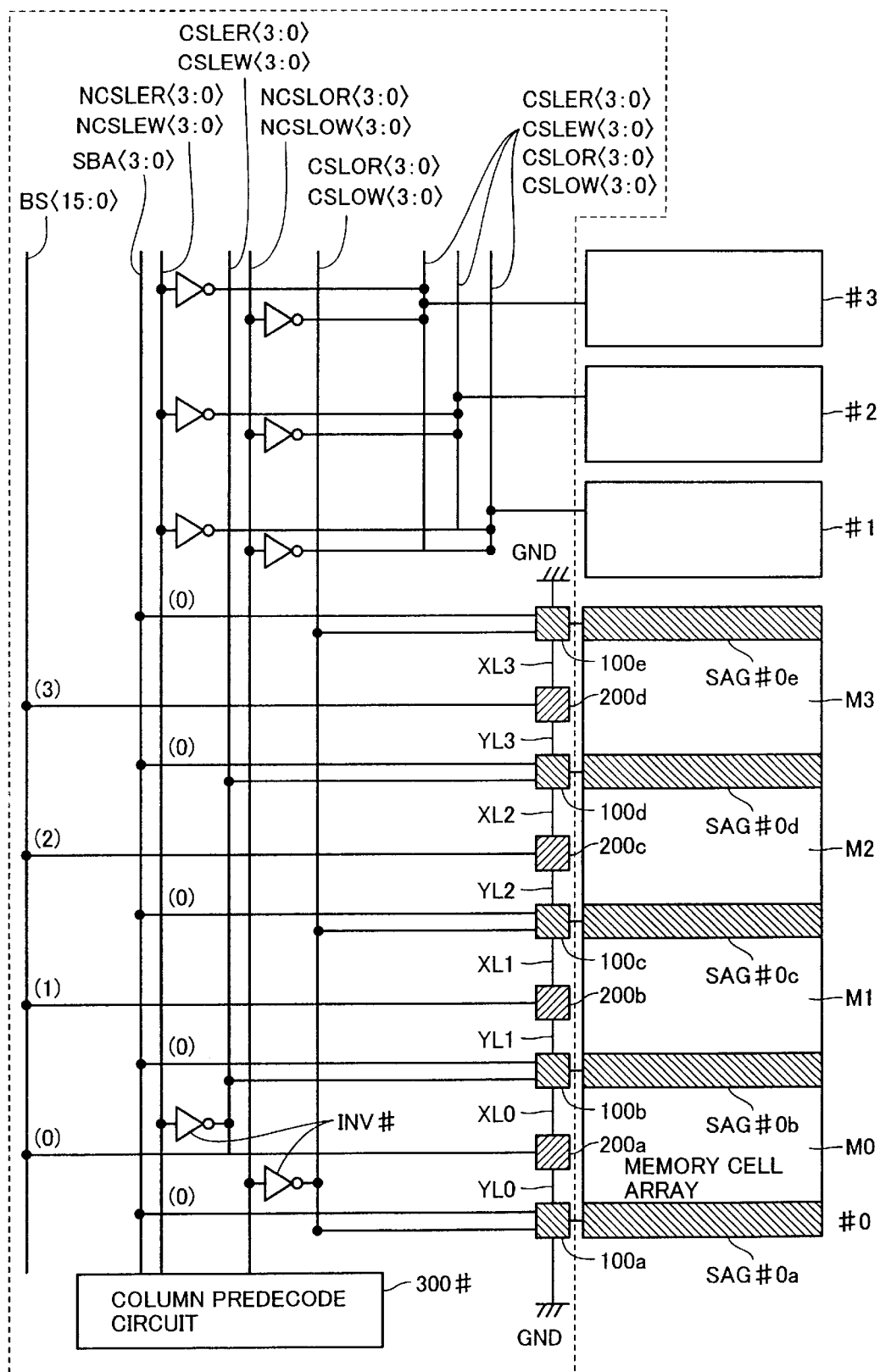
FIG. 23 shows a circuit configuration of a column decode circuit 2*i* in a ninth embodiment of the present invention.

FIG. 23 shows a circuit configuration of a column decode circuit 2i in a ninth embodiment of the present invention.

The present embodiment differs from the eighth embodiment shown in FIG. 22 in that column select lines CSLER<3:0> and CSLEW<3:0>, and CSLOR<3:0> and CSLOW<3:0> are provided for each bank#. The remainder is similar to that described in the eighth embodiment and thus will not be described specifically.

Herein, main column select lines NCSLER<3:0> and NCSLEW<3:0> are shared. Furthermore, for column select lines CSLER<3:0> and CSLEW<3:0>, CSLOR<3:0> and CSLOW<3:0> for each bank, inverter INV# repeats a signal, inverting it, respectively.

In the circuit configuration of the ninth embodiment, column select lines CSLER<3:0> and CSLEW<3:0>, and CSLOR<3:0> and CSLOW<3:0> still lack uniformity, although a column select line provided for each bank can reduce their difference to two to three. Furthermore, inverter INV# shaping a waveform can eliminate a substantial difference in timing, as compared with the eighth embodiment.

Furthermore, main column select lines NCSLER<3:0> and NCSLEW<3:0>, and NCSLOR<3:0> and NCSLOW<3:0> can be uniform in load to reduce an unbalance in load preventing a rapid operation and thus achieve a faster column-related operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

first and second memory banks each including M memory blocks each divided into first and second memory regions, M representing an even number of no less than two, and (M+1) sense amplifier bands each inputting and outputting data to and from one of said first and second memory regions in at least one, adjacent memory block of said M memory blocks, said M memory blocks being each arranged between adjacent two of said (M+1) sense amplifier bands;

a first select line activated when said first memory region is selected; and a second select line activated when said second memory region is selected, said first memory bank having odd-numbered ones of said (M+1) sense amplifier bands each coupled with said first select line to input and output said data to and from said first memory region, and even-numbered ones of said (M+1) sense amplifier bands each coupled with said second select line to input and output said data to and from said second memory region, said second memory bank having odd-numbered ones of said (M+1) sense amplifier bands each coupled with said second select line to input and output said data to and from said second memory region, and even-numbered ones of said (M+1) sense amplifier bands each coupled with said first select line to input and output said data to and from said first memory region.

2. The semiconductor memory device according to claim 1, said M memory blocks each having a plurality of memory cells arranged in rows and columns to hold data, a plurality of bit lines provided to correspond to said rows of said memory cells, respectively, and a plurality of word lines provided to correspond to said columns of said memory cells, respectively, said semiconductor memory device further comprising an input/output line arranged parallel to said plurality of bit lines and connected to each of said (M+1) sense amplifier bands, wherein said first and second select lines traverse said plurality of bit lines.

3. The semiconductor memory device according to claim 1, further comprising a column select circuit connected to said first and second select lines, wherein said first and second select lines transmit a decoded select signal from said column select circuit.

4. A semiconductor device comprising:

a plurality of memory banks each including M memory blocks each having a plurality of memory cells in rows and columns and divided into first and second memory regions having an equal number of columns of memory cells, M representing an even number of no less than two, each said memory bank also including M+1) sense amplifier bands each inputting and outputting data to and from one of said first and second memory regions in at least one adjacent memory block of said M memory blocks, said M blocks being each arranged between adjacent two of said (M+1) sense amplifier bands, said plurality of memory banks each having odd-numbered ones of said (M+1) sense amplifier bands each inputting and outputting said data to and from said first memory region, and even-numbered ones of said (M+1) sense amplifier bands inputting and outputting said data to and from said second memory region;

a predecode circuit generating a first select signal selecting one of said first and second memory regions and a second select signal selecting a column of memory cells in each of said first and second memory regions;

a column select signal line transmitting said second select signal; and (M+1) decode circuits arranged to correspond to said (M+1) sense amplifier bands, respectively, in each of said plurality of memory banks, each operative in response to said first and second select signals to select one of the corresponding columns of memory cells, said (M+1) decode circuit being each connected to said column select signal line.

5. The semiconductor memory device according to claim 4, further comprising a first select line transmitting said first select signal, wherein said (M+1) decode circuits are each further connected to said first select line.

6. The semiconductor memory device according to claim 5, wherein:

said first select line includes a first region select line transmitting a first region select signal and a second region select line transmitting a second region select signal, said first and second region select signals selecting said first and second memory regions, respectively; and said odd-numbered ones of said (M+1) decode circuits are each connected to said first region select line, and said even-numbered ones of said (M+1) decode circuits are each connected to said second region select line.

7. The semiconductor device according to claim 4, further comprising a first select line transmitting said first select signal, wherein:

said column select signal line includes a plurality of subordinate column select signal lines corresponding to said plurality of memory banks respectively; and said (M+1) decode circuits are each connected to a corresponding one of said plurality of subordinate column select signal lines and further to said first select line.

8. The semiconductor memory device according to claim 7, wherein:

said first select line includes a first region select line transmitting a first region select signal and a second region select line transmitting a second region select signal, said first and second region select signals selecting said first and second memory regions, respectively; and said odd-numbered ones of said (M+1) decode circuits are each connected to said first region select line and said even-numbered ones of said (M+1) decode circuits are each connected to said second region select line.

9. A semiconductor memory device comprising:

a plurality of memory banks each including M memory blocks each having a plurality of memory cells in rows and columns and a plurality of bit line provided to respectively correspond to said columns of said memory cells, M representing an even number of no less than two, said M memory blocks being each divided into first and second memory regions each having an equal number of said columns of said memory cells, said plurality of memory banks each further including (M+1) sense amplifier bands each inputting and outputting data to and from one of said first and second memory regions in at least one, adjacent memory block of said M memory blocks, said M blocks being each arranged between adjacent two of said (M+1) sense amplifier bands, said plurality of memory banks each having odd-numbered ones of said (M+1) sense amplifier bands each inputting and outputting said data to and from said first memory region and even-numbered ones of said (M+1) sense amplifier bands each inputting and outputting said data to and from said second memory region;

a plurality of first decode circuits arranged to correspond to said odd-numbered sense amplifier bands, respectively, and each operative to effect a column select operation;

a plurality of second decode circuits arranged to correspond to said even-numbered sense amplifier bands, respectively, and each operative to effect a column select operation;

a first local select line connected to each said first decode circuit to transmit a first select signal to effect said column select operation in said first memory region;

a second local select line connected to each said second decode circuit to transmit a second select signal to effect said column select operation in said second memory region;

a first main select line shared by said plurality of memory banks and transmitting said first select signal;

a second main select line shared by said plurality of memory banks and transmitting said second select signal;

a first signal transmission transmitting said first select signal from said first main select line to said first local select line; and a second signal transmission transmitting said second select signal from said second main select line to said second local select line.

10. The semiconductor memory device according to claim 9, wherein:

said first local select line includes a plurality of first subordinate local select lines corresponding to each of said plurality of memory banks;

said second local select line includes a plurality of second subordinate local select lines corresponding to each of said plurality of memory banks; and in each of said plurality of memory banks, each said first decode circuit is connected to a corresponding one of said plurality of first subordinate local select lines and each said second decode circuit is connected to a corresponding one of said plurality of second subordinate local select lines.

* * * * *